(12) United States Patent
Lee et al.

(10) Patent No.: US 12,501,607 B2
(45) Date of Patent: Dec. 16, 2025

(54) SEMICONDUCTOR MEMORY DEVICE

(71) Applicant: SAMSUNG ELECTRONICS CO., LTD., Suwon-si (KR)

(72) Inventors: Kiseok Lee, Hwaseong-si (KR); Keunnam Kim, Seongnam-si (KR); Hui-Jung Kim, Seongnam-si (KR); Wonsok Lee, Suwon-si (KR); Min Hee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 626 days.

(21) Appl. No.: 17/741,701

(22) Filed: May 11, 2022

(65) Prior Publication Data

US 2023/0055147 A1 Feb. 23, 2023

(30) Foreign Application Priority Data

Aug. 17, 2021 (KR) .......................... 10-2021-0108331

(51) Int. Cl.
*H10B 12/00* (2023.01)
*H10D 30/67* (2025.01)
*H10D 99/00* (2025.01)

(52) U.S. Cl.
CPC ........... *H10B 12/315* (2023.02); *H10B 12/05* (2023.02); *H10B 12/09* (2023.02); *H10B 12/482* (2023.02); *H10B 12/50* (2023.02); *H10D 30/6728* (2025.01); *H10D 30/6755* (2025.01); *H10D 99/00* (2025.01)

(58) Field of Classification Search
CPC ....... G11C 11/4097; G11C 8/14; H10B 12/05; H10B 12/09; H10B 12/31; H10B 12/315; H10B 12/33; H10B 12/48; H10B 12/482; H10B 12/488; H10B 12/50; H10D 30/6728; H10D 30/6755; H10D 99/00; H01L 29/66969; H01L 29/78642; H01L 29/7869

See application file for complete search history.

(56) References Cited

U.S. PATENT DOCUMENTS 4,984,030 A 1/1991 Sunami et al.
8,283,715 B2 10/2012 Lin et al.
(Continued)

FOREIGN PATENT DOCUMENTS

EP 2 246 883 A1 11/2010
KR 1020100026326 A 3/2010
(Continued)

*Primary Examiner* — Britt D Hanley
*Assistant Examiner* — Kevin Quinto
(74) *Attorney, Agent, or Firm* — Muir Patent Law, PLLC

(57) ABSTRACT

A semiconductor memory device is disclosed. The semiconductor memory device may include a bit line extending in a first direction, a word line extending in a second direction perpendicular to the first direction, a channel pattern between the bit line and the word line, the channel pattern including a horizontal channel portion, which is connected to the bit line, and a vertical channel portion, which is extended from the horizontal channel portion in a third direction perpendicular to the first and second directions, and a gate insulating pattern between the word line and the channel pattern. The horizontal channel portion of the channel pattern may be disposed parallel to a fourth direction that is inclined to the first and second directions.

6 Claims, 46 Drawing Sheets

(56) References Cited

U.S. PATENT DOCUMENTS

| | | | |
|---|---|---|---|
| 9,041,086 B2 | 5/2015 | Lindholm et al. | |
| 9,230,853 B2 | 1/2016 | Yu et al. | |
| 9,293,204 B2 | 3/2016 | Do et al. | |
| 9,653,565 B2 | 5/2017 | Jang et al. | |
| 10,388,658 B1 * | 8/2019 | Ramaswamy | H10D 30/025 |
| 10,529,720 B2 | 1/2020 | Sills et al. | |
| 10,607,988 B2 | 3/2020 | Karda et al. | |
| 10,950,608 B2 | 3/2021 | Moon et al. | |
| 2001/0012223 A1 * | 8/2001 | Kohyama | H10B 12/09 |
| | | | 257/E21.648 |
| 2010/0123170 A1 * | 5/2010 | Fujimoto | H10D 30/63 |
| | | | 257/532 |
| 2011/0024870 A1 * | 2/2011 | Lee | H10B 12/48 |
| | | | 257/E21.085 |
| 2011/0111568 A1 * | 5/2011 | Kim | H10B 12/482 |
| | | | 257/E21.421 |
| 2012/0039104 A1 * | 2/2012 | Lin | H10D 84/038 |
| | | | 257/334 |
| 2012/0056255 A1 * | 3/2012 | Sukekawa | H10B 12/053 |
| | | | 257/329 |
| 2014/0131810 A1 | 5/2014 | Masuoka et al. | |
| 2015/0287745 A1 * | 10/2015 | Kato | H01L 29/7869 |
| | | | 257/43 |
| 2019/0333917 A1 | 10/2019 | Ramaswamy | |
| 2019/0393222 A1 | 12/2019 | Sharma et al. | |
| 2020/0111800 A1 | 4/2020 | Ramaswamy | |
| 2020/0203357 A1 | 6/2020 | Chhajed et al. | |
| 2020/0343246 A1 | 10/2020 | Wang et al. | |
| 2020/0395362 A1 | 12/2020 | Park | |
| 2021/0066278 A1 | 3/2021 | Kim et al. | |
| 2021/0066585 A1 | 3/2021 | Lee | |
| 2021/0183864 A1 | 6/2021 | Ramaswamy | |
| 2023/0031076 A1 | 2/2023 | Miyashita et al. | |
| 2024/0186319 A1 | 6/2024 | Hua et al. | |

FOREIGN PATENT DOCUMENTS

| | | |
|---|---|---|
| KR | 1020110012660 A | 2/2011 |
| KR | 1020200138412 A | 12/2020 |
| KR | 1020200143113 A | 12/2020 |
| TW | I527161 B | 3/2016 |

* cited by examiner

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2021-0108331, filed on Aug. 17, 2021, in the Korean Intellectual Property Office, the entire contents of which are hereby incorporated by reference.

BACKGROUND

1. Field

The present disclosure relates to a semiconductor memory device, and in particular, to a semiconductor memory device including vertical channel transistors and a method of fabricating the same.

2. Description of the Related Art

As a design rule of a semiconductor device decreases, it is possible to increase an integration density and an operation speed of the semiconductor device, but new technologies are required to improve or maintain a production yield. Thus, semiconductor devices with vertical channel transistors have been suggested to increase an integration density of a semiconductor device and improve resistance and current driving characteristics of the transistor.

SUMMARY

According to an embodiment, a semiconductor memory device may include a bit line extending in a first direction, a word line extending in a second direction perpendicular to the first direction, a channel pattern between the bit line and the word line, the channel pattern including a horizontal channel portion, which is connected to the bit line, and a vertical channel portion, which is extended from the horizontal channel portion in a third direction perpendicular to the first and second directions, and a gate insulating pattern between the word line and the channel pattern. The horizontal channel portion of the channel pattern may be disposed parallel to a fourth direction that is inclined to the first and second directions.

According to an embodiment, a semiconductor memory device may include a bit line extending in a first direction, a first word line and a second word line extending in a second direction perpendicular to the first direction, a channel pattern provided between the bit line and the first and second word lines, the channel pattern including first and second vertical channel portions, which are spaced apart from each other in a third direction inclined to the first and second directions, and a horizontal channel portion, which connects the first and second vertical channel portions to each other, and a gate insulating pattern provided between the first and second word lines and the channel pattern.

According to an embodiment, a semiconductor memory device may include a peripheral circuit structure including peripheral circuits, which are provided on a semiconductor substrate, and a lower insulating layer, which is provided to cover the peripheral circuits, bit lines extending in a first direction on the peripheral circuit structure, a mold insulating pattern having trenches, which are extended in a second direction to cross the bit lines, a first word line and a second word line, which are provided in each of the trenches and are extended in the second direction to cross the bit lines, channel patterns provided between the bit lines and the first and second word lines, each of the channel patterns including first and second vertical channel portions, which are spaced apart from each other in a third direction inclined to the first and second directions, and a horizontal channel portion, which is provided to connect the first and second vertical channel portions to each other, a gate insulating pattern, which is disposed between the channel patterns and the first and second word lines and is extended in the second direction, landing pads connected to the first and second vertical channel portions of the channel patterns, respectively, and data storage patterns disposed on the landing pads, respectively.

BRIEF DESCRIPTION OF THE DRAWINGS

Features will become apparent to those of skill in the art by describing in detail exemplary embodiments with reference to the attached drawings, in which:

FIGS. 13A to 20A are plan views illustrating stages in a method of fabricating a semiconductor memory device, according to an embodiment.

FIGS. 12B to 20B, 12C to 20C, 21A to 23A, and 21B to 23B are sectional views illustrating stages in a method of fabricating a semiconductor memory device, according to an embodiment.

DETAILED DESCRIPTION

Figure 1:
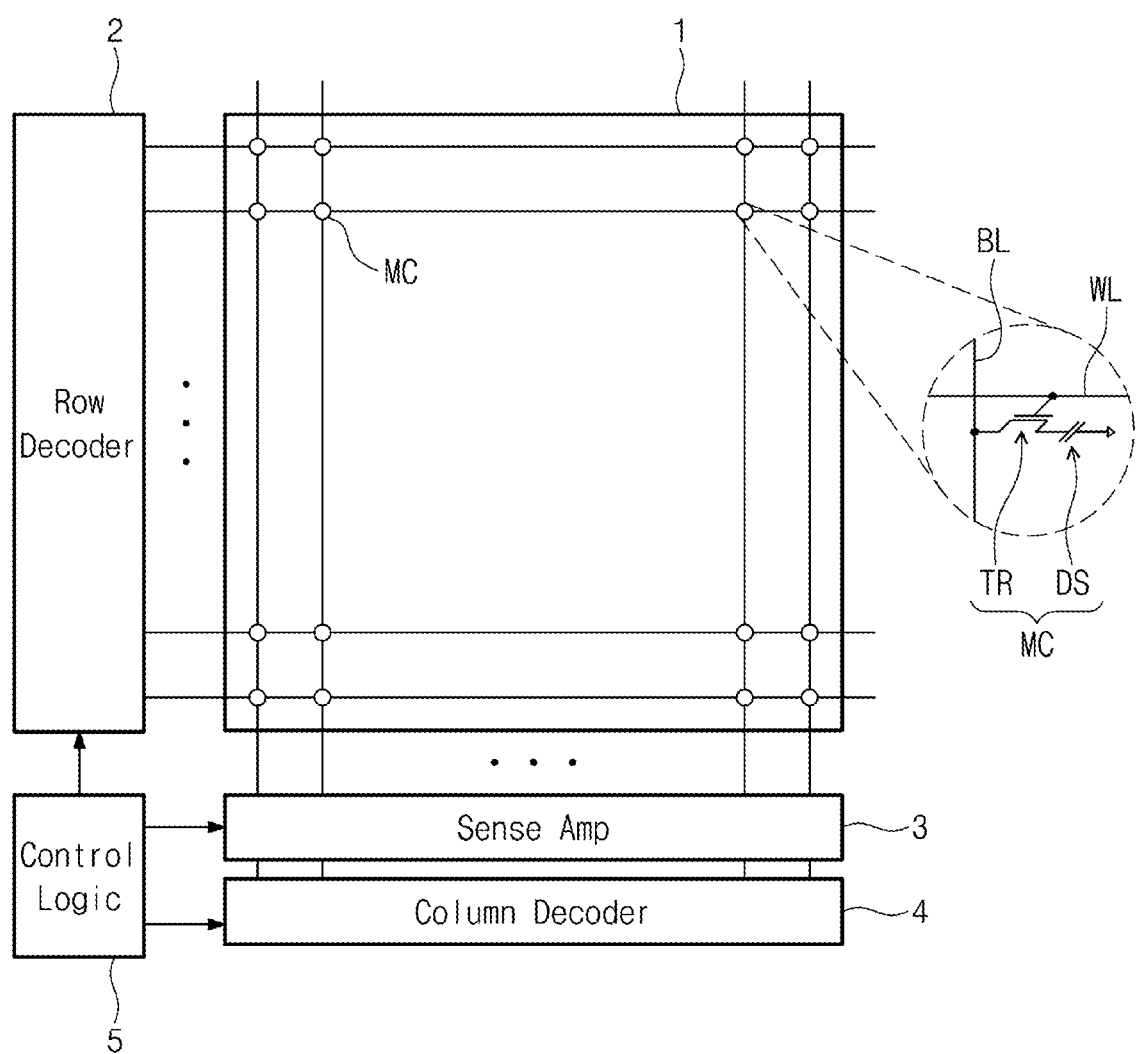
FIG. 1 is a block diagram illustrating a semiconductor memory device including a semiconductor element, according to an embodiment.

FIG. 1 is a block diagram illustrating a semiconductor memory device including a semiconductor element, according to an embodiment.

Referring to FIG. 1, a semiconductor memory device may include a memory cell array 1, a row decoder 2, a sense amplifier 3, a column decoder 4, and a control logic 5.

The memory cell array 1 may include a plurality of memory cells MC, which are two-dimensionally or three-dimensionally arranged. Each of the memory cells MC may be provided between and connected to a word line WL and a bit line BL, which are disposed to cross each other.

Each of the memory cells MC may include a selection element TR and a data storage element DS, which are electrically connected to each other in series. The selection element TR may be provided between and connected to the data storage element DS and the word line WL, and the data storage element DS may be connected to the bit line BL through the selection element TR. The selection element TR may be a field effect transistor (FET), and the data storage element DS may be realized using at least one of a capacitor, a magnetic tunnel junction pattern, or a variable resistor. As an example, the selection element TR may include a transistor whose gate electrode is connected to the word line WL and whose drain/source terminals are connected to the bit line BL and the data storage element DS, respectively.

The row decoder 2 may be configured to decode address information, which is input from the outside, and to select one of the word lines WL of the memory cell array 1, based on the decoded address information. The address information decoded by the row decoder 2 may be provided to a row driver, and in this case, the row driver may provide respective voltages to the selected one of the word lines WL and the unselected ones of the word lines WL, in response to the control of a control circuit.

The sense amplifier 3 may be configured to sense, amplify, and output a difference in voltage between one of the bit lines BL, which is selected based on address information decoded by the column decoder 4, and a reference bit line.

The column decoder 4 may be used as a data transmission path between the sense amplifier 3 and an external device (e.g., a memory controller). The column decoder 4 may be configured to decode address information, which is input from the outside, and to select one of the bit lines BL, based on the decoded address information.

The control logic 5 may be configured to generate control signals, which are used to control data-writing or data-reading operations on the memory cell array 1.

Figure 2:
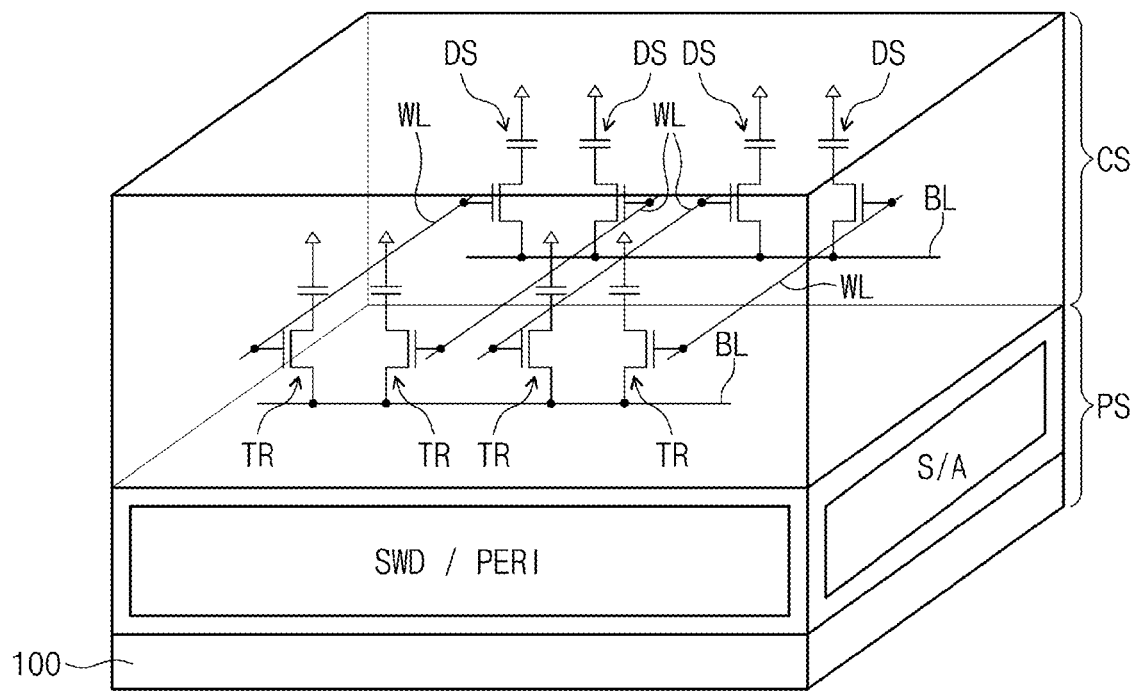
FIG. 2 is a perspective view schematically illustrating a semiconductor memory device according to an embodiment.
Figure 2:
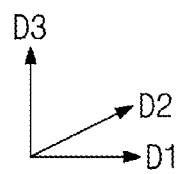

FIG. 2 is a perspective view schematically illustrating a semiconductor memory device according to an embodiment.

Referring to FIG. 2, a semiconductor memory device may include a peripheral circuit structure PS on a semiconductor substrate 100 and a cell array structure CS on the peripheral circuit structure PS.

The peripheral circuit structure PS may include core and peripheral circuits, which are formed on the semiconductor substrate 100. The core and peripheral circuits may include the row and column decoders 2 and 4, the sense amplifier 3, and the control logics 5 described with reference to FIG. 1. The peripheral circuit structure PS may be provided between the semiconductor substrate 100 and the cell array structure CS, in a third direction D3 perpendicular to a top surface of the semiconductor substrate 100.

The cell array structure CS may include the bit lines BL, the word lines WL, and the memory cells MC therebetween (e.g., see FIG. 1). The memory cells MC (e.g., see FIG. 1) may be two- or three-dimensionally arranged on a plane, which are extended in first and second directions D1 and D2 that are not parallel to each other. Each of the memory cells MC (e.g., see FIG. 1) may include the selection element TR and the data storage element DS, as described above.

In an embodiment, a vertical channel transistor (VCT) may be provided as the selection element TR of each memory cell MC (e.g., see FIG. 1). The vertical channel transistor may mean a transistor whose channel region is extended in a direction perpendicular to the top surface of the semiconductor substrate 100 (i.e., in the third direction D3). In addition, a capacitor may be provided as the data storage element DS of each memory cell MC (e.g., see FIG. 1).

Figure 3:
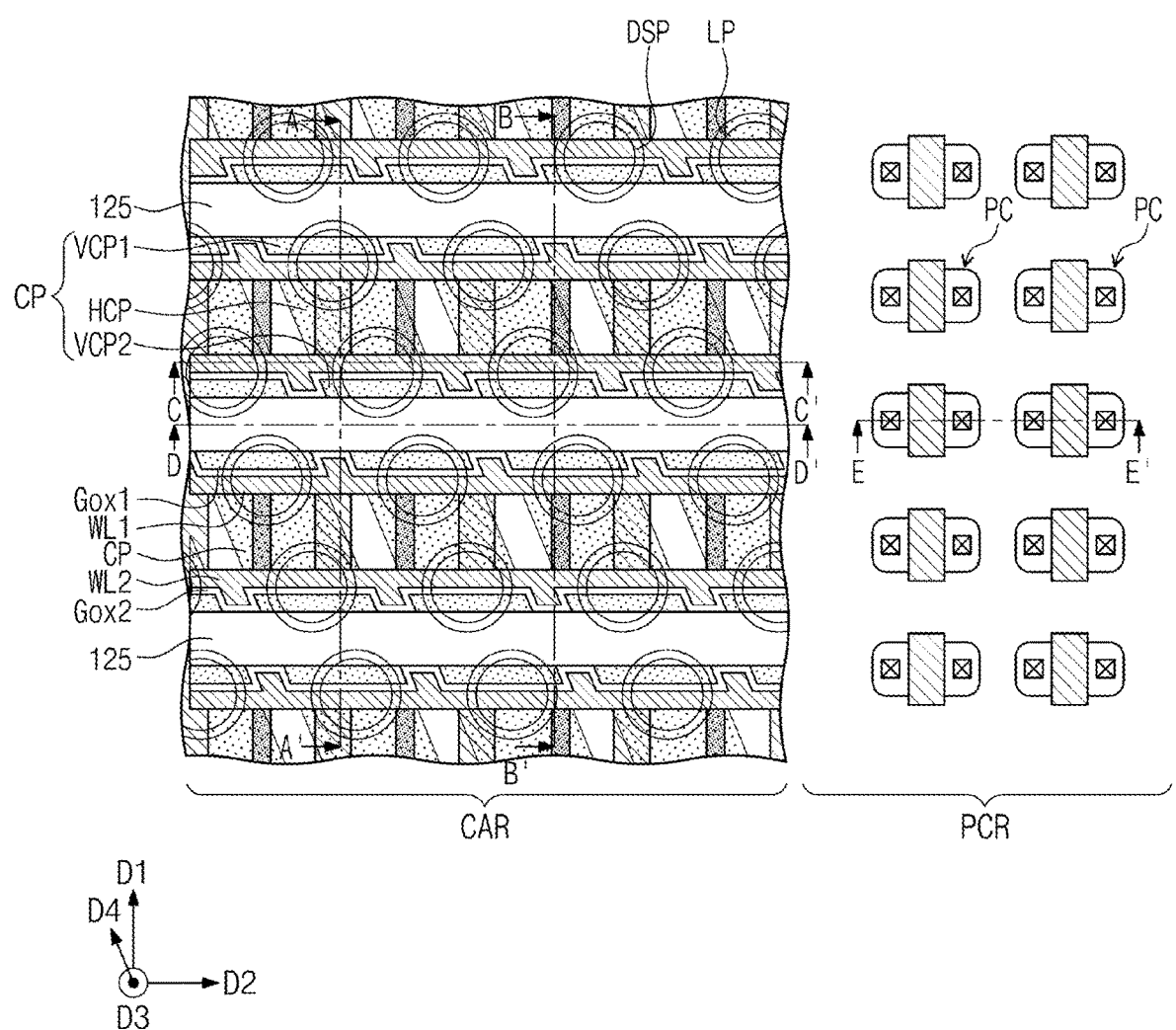
FIG. 3 is a plan view illustrating a semiconductor memory device according to an embodiment.
Figure 4A:
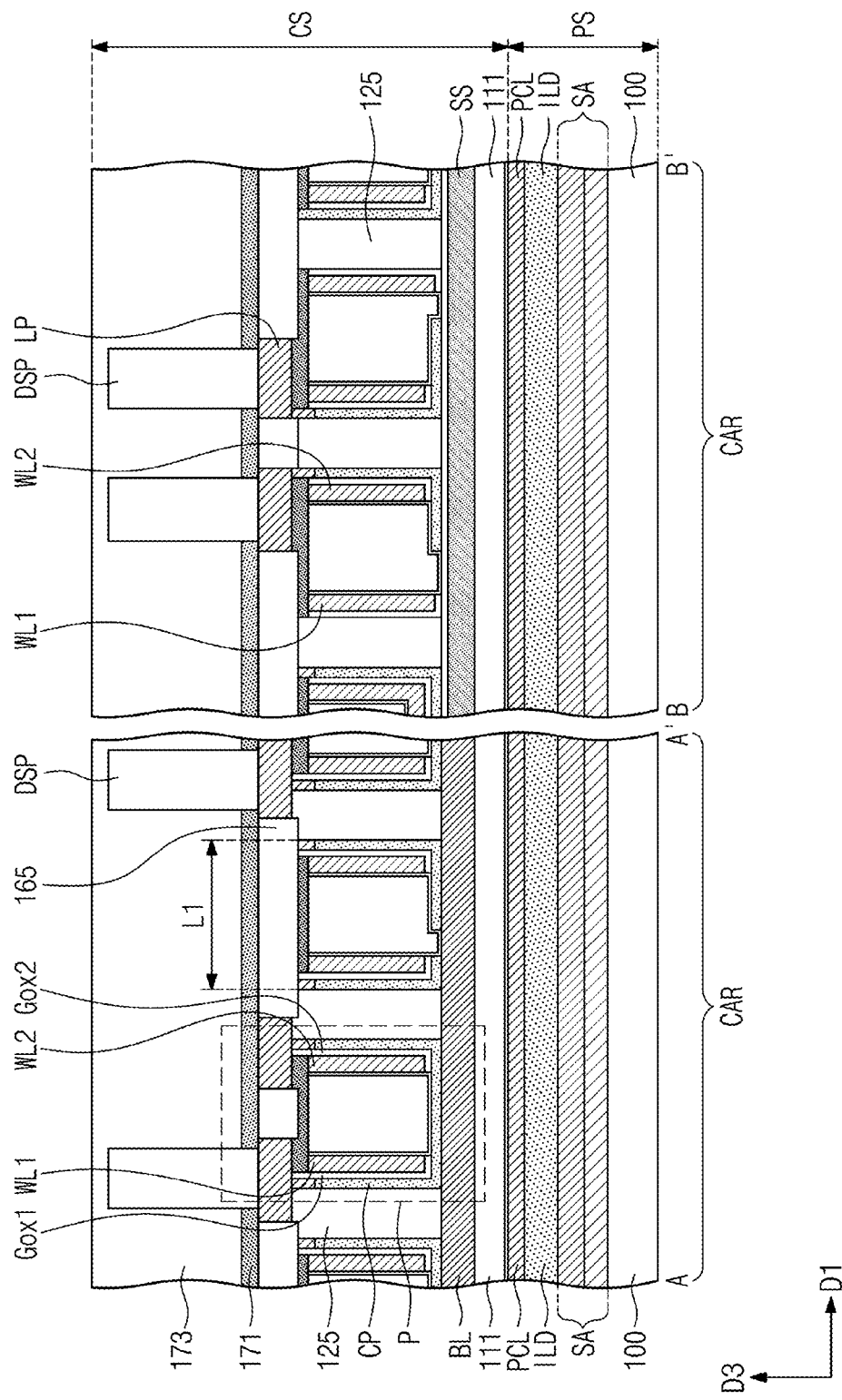
FIGS. 4A and 4B are sectional views illustrating cross-sections taken along lines A-A', B-B', C-C', D-D', and E-E' of FIG. 3.
Figure 4B:
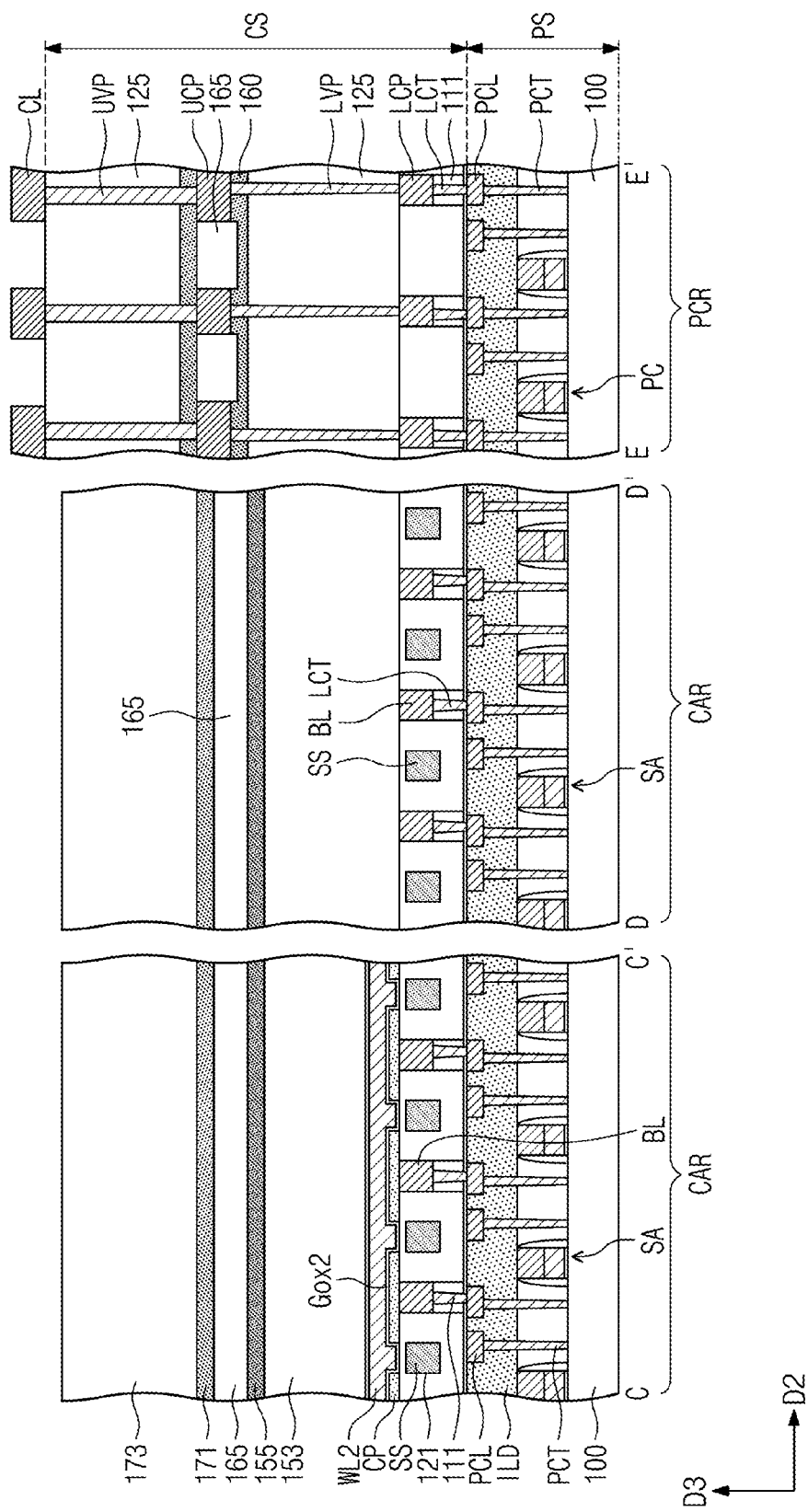
Figure 5:
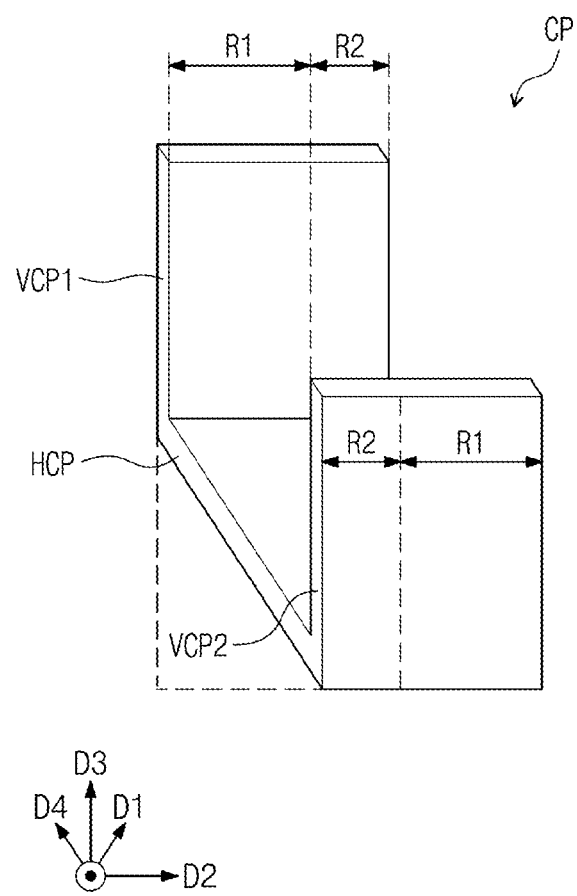
FIG. 5 is a diagram illustrating a channel pattern of a semiconductor memory device according to an embodiment.

FIG. 3 is a plan view illustrating a semiconductor memory device according to an embodiment. FIGS. 4A and 4B are sectional views illustrating cross-sections taken along lines A-A', B-B', C-C', D-D', and E-E' of FIG. 3. FIG. 5 is a diagram illustrating a channel pattern of a semiconductor memory device according to an embodiment. FIGS. 6A, 6B, 6C, and 6D are enlarged sectional views, each of which illustrates portion 'P' of FIG. 4A.

Referring to FIGS. 3, 4A, and 4B, a semiconductor memory device according to an embodiment may include the peripheral circuit structure PS and the cell array structure CS.

The peripheral circuit structure PS may include core and peripheral circuits SA and PC, which are integrated on the top surface of the semiconductor substrate 100, a peripheral circuit insulating layer ILD, which is provided to cover the core and peripheral circuits SA and PC, peripheral contact plugs PCT, and peripheral circuit lines PCL.

In detail, the semiconductor substrate 100 may be a single-crystalline silicon substrate. The semiconductor substrate 100 may include a cell array region CAR and a peripheral circuit region PCR.

The core circuit SA including the sense amplifier 3 (e.g., see FIG. 1) may be provided on the cell array region CAR of the semiconductor substrate 100, and the peripheral circuits PC, e.g., a word line driver and the control logic 5 (e.g., see FIG. 1), may be provided on the peripheral circuit region PCR of the semiconductor substrate 100.

The core and peripheral circuits SA and PC may include NMOS and PMOS transistors, which are integrated on the semiconductor substrate 100. The core and peripheral circuits SA and PC may be electrically connected to the bit lines BL and the word lines WL through the peripheral circuit lines PCL and the peripheral circuit contact plugs PCT. The sense amplifiers may be electrically connected to the bit lines BL, and each of the sense amplifiers may be configured to amplify and output a difference in voltage level between voltages which are sensed by a pair of the bit lines BL.

The peripheral circuit insulating layer ILD may be provided on the semiconductor substrate 100 to cover the core and peripheral circuits SA and PC, the peripheral circuit lines PCL, and the peripheral circuit contact plugs PCT. The peripheral circuit insulating layer ILD may have a substantially flat top surface. The peripheral circuit insulating layer ILD may include a plurality of vertically-stacked insulating layers. For example, the peripheral circuit insulating layer ILD may include a silicon oxide layer, a silicon nitride layer, a silicon oxynitride layer, and/or a low-k dielectric layer.

The cell array structure CS may be provided on the peripheral circuit insulating layer ILD. The cell array structure CS may include a plurality of the bit lines BL, channel patterns CP, first and second word lines WL1 and WL2, a gate insulating pattern Gox, and data storage patterns DSP.

The bit lines BL may be provided on the peripheral circuit insulating layer ILD to extend, e.g., lengthwise, in the first direction D1 and may be spaced apart from each other in the second direction D2. Here, the first and second directions D1 and D2 may be parallel to the top surface of the semiconductor substrate 100. The bit lines BL may have a first width W1 in the second direction D2, and the first width W1 may range from about 1 nm to about 50 nm.

The bit lines BL may be formed of or include at least one of, e.g., doped polysilicon, metallic materials, conductive metal nitrides, conductive metal silicides, conductive metal oxides, or combinations thereof. The bit lines BL may be formed of at least one of, e.g., doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof. Each of the bit lines BL may have a single- or multi-layered structure that is formed of at least one of the afore-described materials. For example, the bit lines BL may be formed of or include at least one of two- and three-dimensional materials, such as a carbon-based two-dimensional material (e.g., graphene), a carbon-based three-dimensional material (e.g., carbon nanotube), or combinations thereof.

The bit lines BL may be connected to the peripheral circuit lines PCL through lower contact plugs LCT. Furthermore, lower conductive patterns LCP, which are located at the same level as the bit lines BL, may be disposed on the peripheral circuit region PCR. The lower conductive patterns LCP may be connected to the peripheral circuit lines PCL through the lower contact plugs LCT. The lower conductive patterns LCP may be formed of or include the same conductive material as the bit lines BL.

Lower insulating patterns 111 may be disposed between the bit lines BL and the peripheral circuit lines PCL and between the lower conductive patterns LCP and the peripheral circuit lines PCL to enclose the lower contact plugs LCT, respectively.

A first insulating pattern 121 may be disposed between the bit lines BL. The first insulating pattern 121 may be formed of or include at least one of, e.g., silicon oxide, silicon nitride, silicon oxynitride, and/or low-k dielectric materials.

Shielding structures SS may be respectively provided between the bit lines BL and may be extended in the first direction D1 and parallel to each other. The shielding structures SS may be formed of or include at least one of conductive materials (e.g., metallic materials). The shielding structures SS may be provided in the first insulating pattern 121, and top surfaces of the shielding structures SS may be located at a level lower than top surfaces of the bit lines BL.

In an embodiment, the shielding structures SS may be formed of a conductive material, and an air gap or void may be formed in the shielding structure SS. In another embodiment, air gaps, instead of the shielding structures SS, may be defined in the first insulating pattern 121.

A mold insulating pattern 125 may be disposed on the first insulating pattern 121 and the bit lines BL. The mold insulating pattern 125 may define trenches T (e.g., see FIG. 15A), which are extended in the second direction D2 to cross the bit lines BL and are spaced apart from each other in the first direction D1. The mold insulating pattern 125 may cover top surfaces of the lower conductive patterns LCP, on the peripheral circuit region PCR. The mold insulating pattern 125 may be formed of or include at least one of, e.g., silicon oxide, silicon nitride, silicon oxynitride, and/or low-k dielectric materials.

The channel patterns CP may be disposed on the bit lines BL. In each of the trenches T (e.g., see FIG. 15A) of the mold insulating pattern 125, the channel patterns CP may be spaced apart from each other in the second direction D2. The channel patterns CP may be spaced apart from each other on each bit line BL in a fourth direction D4, which is inclined, e.g., at an oblique angle, with respect to the first and second directions D1 and D2, by the mold insulating pattern 125. Here, the fourth direction D4 may be parallel to the top surface of the semiconductor substrate 100, e.g., the fourth direction D4 may be in a same plane as the first and second directions D1 and D2 and at an oblique angle with respect to each of the first and second directions D1 and D2. The channel patterns CP may be spaced apart from each other by a specific distance in the second direction D2. Each of the channel patterns CP may have a width that is larger than those of the bit lines BL, when measured in the second direction D2.

Figure 6A:
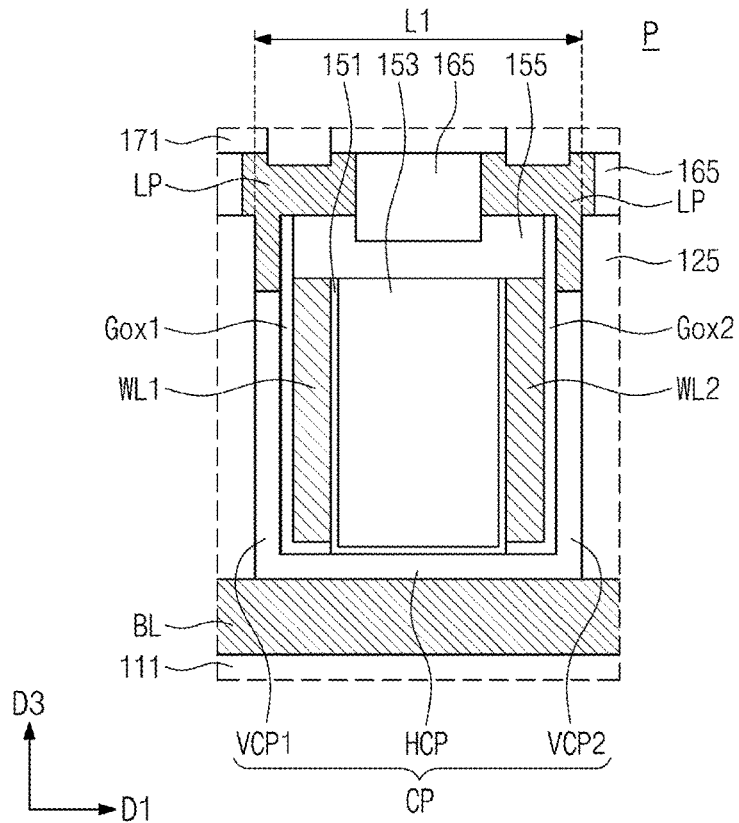
FIGS. 6A, 6B, 6C, and 6D are enlarged sectional views, each of which illustrates portion 'P' of FIG. 4A.

In more detail, referring to FIGS. 3, 5, and 6A, each of the channel patterns CP may include first and second vertical channel portions VCP1 and VCP2, which are opposite to each other in the fourth direction D4, and a horizontal channel portion HCP, which is connected to the bit line BL and is provided to connect the first and second vertical channel portions VCP1 and VCP2 to each other. The horizontal channel portion HCP may be extended in the fourth direction D4, and each of the channel patterns CP may have a parallelogram or diamond shape, when viewed in a plan view (e.g., dotted parallelograms in FIG. 3). A portion of the horizontal channel portion HCP may be located between the first and second word lines WL1 and WL2. The horizontal channel portion HCP of the channel pattern CP may electrically connect the first and second vertical channel portions VCP1 and VCP2 to a corresponding one of the bit lines BL. That is, in the semiconductor memory device according to an embodiment, a pair of vertical channel transistors may be provided to share one of the bit lines BL.

In an embodiment, the first and second vertical channel portions VCP1 and VCP2 of the channel patterns CP may be arranged to form a zigzag shape in the first or second direction D1 or D2, when viewed in a plan view. For example, referring to FIG. 3, the first and second vertical channel portions VCP1 and VCP2 of each channel pattern CP may be offset from each other along the second direction D2 (e.g., to define a parallelogram shape).

In more detail, referring to FIG. 6A, the horizontal channel portions HCP of the channel patterns CP may be in direct contact with the top surfaces of the bit lines BL. A thickness of the horizontal channel portion HCP on, e.g., from, the top surface of the bit line BL (e.g., along the third direction D3) may be substantially equal to thicknesses of the first and second vertical channel portions VCP1 and VCP2 on, e.g., from, a side surface of the mold insulating pattern 125 (e.g., along the first direction D1).

Each of the first and second vertical channel portions VCP1 and VCP2 may have an outer side surface, which is in contact with the mold insulating pattern 125, and an inner side surface, which is opposite to the outer side surface. The inner side surfaces of the first and second vertical channel portions VCP1 and VCP2 may face each other in the fourth direction D4.

Referring to FIGS. 3 and 5, each of the first and second vertical channel portions VCP1 and VCP2 may include a first region R1, which is a non-overlap region between the first and second vertical channel portions VCP1 and VCP2 in the first direction D1, and a second region R2, which is an overlap region between the first and second vertical channel portions VCP1 and VCP2 in the first direction D1. In each of the first and second vertical channel portions VCP1 and VCP2, an area of the overlap region (i.e., the second region R2) may be smaller than an area of the non-overlap region (i.e., the first region R1). Accordingly, it may be possible to reduce a coupling between the channel patterns CP, which are adjacent to each other in the first direction D1.

The first and second vertical channel portions VCP1 and VCP2 may have a vertical length in the third direction D3, which is perpendicular to the top surface of the semiconductor substrate 100, and may have a width in the first direction D1. The vertical length of the first and second vertical channel portions VCP1 and VCP2 may be about 2 to 10 times the width thereof. The widths, e.g., thicknesses, of the first and second vertical channel portions VCP1 and VCP2 in the first direction D1 may be in the range of several nanometers to several tens of nanometers. For example, the widths of the first and second vertical channel portions VCP1 and VCP2 may range from 1 nm to 30 nm or in particular from 1 nm to 10 nm.

In each of the channel patterns CP, the horizontal channel portion HCP may include a common source/drain region, an upper end of the first vertical channel portion VCP1 may include a first source/drain region, and an upper end of the second vertical channel portion VCP2 may include a second source/drain region. The first vertical channel portion VCP1 may include a first channel region between the first source/drain region and the common source/drain region, and the second vertical channel portion VCP2 may include a second channel region between the second source/drain region and the common source/drain region. In an embodiment, the first channel region of the first vertical channel portion VCP1 may be controlled by the first word line WL1, and the second channel region of the second vertical channel portion VCP2 may be controlled by the second word line WL2.

In an embodiment, the channel patterns CP may be formed of or include at least one oxide semiconductor material (e.g., $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_{x-}In_yZn_zO$, $Ga_xZn_ySn_zO$, $Al_xZn_ySn_zO$, $Yb_xGa_yZn_zO$, $In_xGa_yO$, or combinations thereof). As an example, the channel patterns CP may be formed of or include indium gallium zinc oxide (IGZO). The channel patterns CP may include a single or multiple layer made of the oxide semiconductor material. The channel patterns CP may be formed of or include an amorphous, single-crystalline, or poly-crystalline oxide semiconductor material. In an embodiment, the channel patterns CP may have a band gap energy that is greater than that of silicon. For example, the channel patterns CP may have a band gap energy of about 1.5 eV to 5.6 eV. In an embodiment, when the channel patterns CP have a band gap energy of about 2.0 eV to 4.0 eV, they may have an optimized channel property. In an embodiment, the channel patterns CP may have polycrystalline or amorphous structure. In an embodiment, the channel patterns CP may be formed of or include a two-dimensional semiconductor material (e.g., graphene, carbon nanotube, or combinations thereof).

Referring to FIGS. 3, 4A, 4B, and 6A, the first and second word lines WL1 and WL2 may be extended in the second direction D2 to cross the bit lines BL and the channel patterns CP and may be alternately arranged in the first direction D1. A pair of the first and second word lines WL1 and WL2 may be disposed on the horizontal channel portion HCP and between the first and second vertical channel portions VCP1 and VCP2 of each channel pattern CP.

Each of the first and second word lines WL1 and WL2 may have an inner side surface and an outer side surface, which are opposite to each other, and the outer side surfaces of the first and second word lines WL1 and WL2 may be disposed on the horizontal channel portion HCP to face each other. The inner side surface of the first word line WL1 may be adjacent to the inner side surface of the first vertical channel portion VCP1, and the inner side surface of the second word line WL2 may be adjacent to the inner side surface of the second vertical channel portion VCP2. The first word line WL1 may be adjacent to the first channel region of the first vertical channel portion VCP1, and the second word line WL2 may be adjacent to the second channel region of the second vertical channel portion VCP2.

The first and second word lines WL1 and WL2 may have a width that is smaller than half a distance L1 (i.e., the width of the trench) between the mold insulating patterns 125, when measured in the first direction D1. The width of the first and second word lines WL1 and WL2 may range from about 1 nm to about 50 nm.

The first and second word lines WL1 and WL2 may be formed of or include at least one of, e.g., doped polysilicon, metallic materials, conductive metal nitrides, conductive metal silicides, conductive metal oxides, or combinations thereof. The first and second word lines WL1 and WL2 may be formed of at least one of, e.g., doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof. The first and second word lines WL1 and WL2 may have a single- or multi-layered structure that is formed of at least one of the afore-described materials. In an embodiment, the first and second word lines WL1 and WL2 may be formed of or include a two-dimensional semiconductor material (e.g., graphene, carbon nanotube, or combinations thereof).

A first capping pattern 151 and a second insulating pattern 153 may be disposed between a pair of the first and second word lines WL1 and WL2. The first capping pattern 151 may be disposed between the outer side surfaces of the first and second word lines WL1 and WL2 and the second insulating pattern 153, and between the top surface of the horizontal channel portion HCP of the channel pattern CP and the second insulating pattern 153. The first capping pattern 151 may have a substantially uniform thickness and may be formed of an insulating material different from the second insulating pattern 153. The first capping pattern 151 and the second insulating pattern 153 may be extended in the second direction D2.

A second capping pattern 155 may be provided on top surfaces of first and second vertical portions VP1 and VP2 of the first and second word lines WL1 and WL2. The second capping pattern 155 may cover a top surface of the first capping pattern 151 and a top surface of the second insulating pattern 153. The second capping pattern 155 may be extended in the second direction D2. In an embodiment, a top surface of the second capping pattern 155 may be substantially coplanar with a top surface of the mold insulating pattern 125. The second capping pattern 155 may be formed of an insulating material that is different from the second insulating pattern 153.

As further illustrated in FIG. 6A, a first gate insulating pattern Gox1 may be disposed between the first word line WL1 and the channel pattern CP, and a second gate insulating pattern Gox2 may be disposed between the second word line WL2 and the channel pattern CP. The first and second gate insulating patterns Gox1 and Gox2 may be extended in the second direction D2 to be parallel to the first and second word lines WL1 and WL2. The first and second gate insulating patterns Gox1 and Gox2 may cover surfaces of the channel patterns CP with a uniform thickness. Between adjacent ones of the channel patterns CP in the second direction D2, the gate insulating pattern Gox may be in direct contact with a top surface of the first insulating pattern 121 and side surfaces of the mold insulating pattern 125.

Each of the first and second gate insulating patterns Gox1 and Gox2 may have substantially a 'L'-shaped section, like the first and second word lines WL1 and WL2. In other words, each of the first and second gate insulating patterns Gox1 and Gox2 may include a horizontal portion covering the horizontal channel portion HCP and a vertical portion covering the first and second vertical channel portions VCP1 and VCP2, similar to the first and second word lines WL1 and WL2.

The first and second gate insulating patterns Gox1 and Gox2 may be formed of at least one of, e.g., silicon oxide, silicon oxynitride, high-k dielectric materials whose dielectric constants are higher than the silicon oxide, or combinations thereof. The high-k dielectric materials may include at least one of metal oxides or metal oxynitrides. For example, the high-k dielectric material for the gate insulating layer may include $HfO_2$, HfSiO, HfSiON, HfTaO, HfSiO, HfZrO, $ZrO_2$, $Al_2O_3$, or combinations thereof.

Figure 6B:
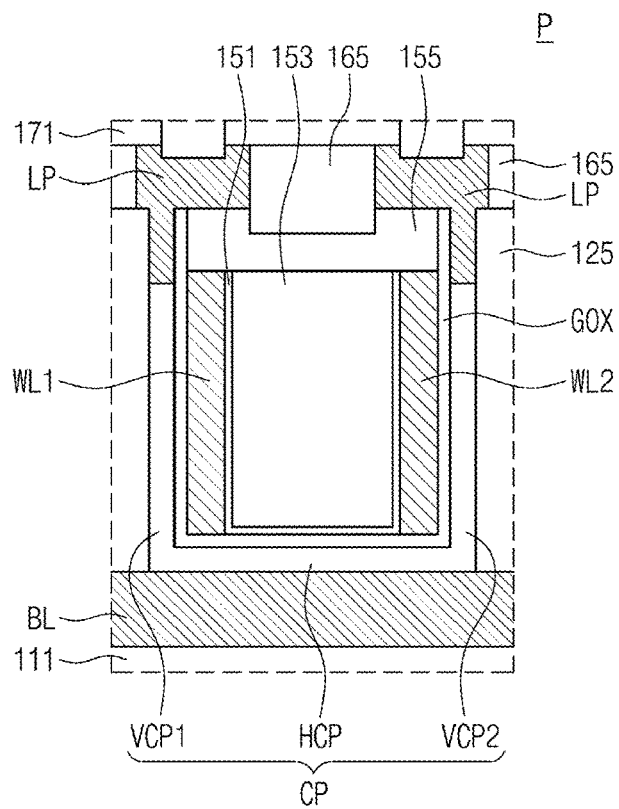

Meanwhile, in the embodiment of FIG. 6B, the gate insulating pattern Gox may be disposed in common between the channel pattern CP and the first and second word lines WL1 and WL2. The gate insulating pattern Gox may cover the surface of the channel pattern CP with a uniform thickness. A portion of the gate insulating pattern Gox may be disposed between the first and second word lines WL1 and WL2. In this case, the portion of the gate insulating pattern Gox may be in contact with the first capping pattern 151.

Figure 6C:
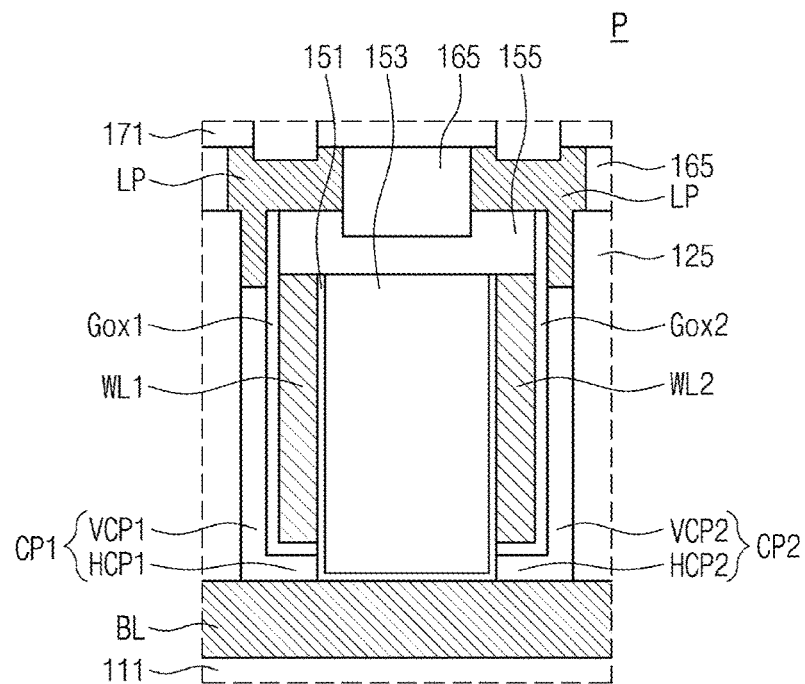

In the embodiment shown in FIG. 6C, the first and second channel patterns CP1 and CP2 may be disposed on the bit line BL to be spaced apart from each other in the first direction D1. The first channel pattern CP1 may include a first horizontal channel portion HCP1, which is in contact with the bit line BL, and the first vertical channel portion VCP1, which is vertically extended from the first horizontal channel portion HCP1 and is adjacent to the first vertical portion VP1 of the first word line WL1. The second channel pattern CP2 may include a second horizontal channel portion HCP2, which is in contact with the bit line BL, and the second vertical channel portion VCP2, which is vertically extended from the second horizontal channel portion HCP2 and is adjacent to the outer side surface of the second word line WL2.

The side surface of the first horizontal channel portion HCP1 of the first channel pattern CP1 and the side surface of the first gate insulating pattern Gox1 may be aligned, e.g., coplanar, with the outer side surface of the first word line WL1. Similarly, the side surface of the second horizontal channel portion HCP2 of the second channel pattern CP2 and the side surface of the second gate insulating pattern Gox2 may be aligned, e.g., coplanar, with the outer side surface of the second word line WL2.

In the case where, on the bit line BL, the first and second channel patterns CP1 and CP2 are spaced apart from each other, the first capping pattern 151 may be in contact with the top surface of the bit line BL.

Figure 6D:
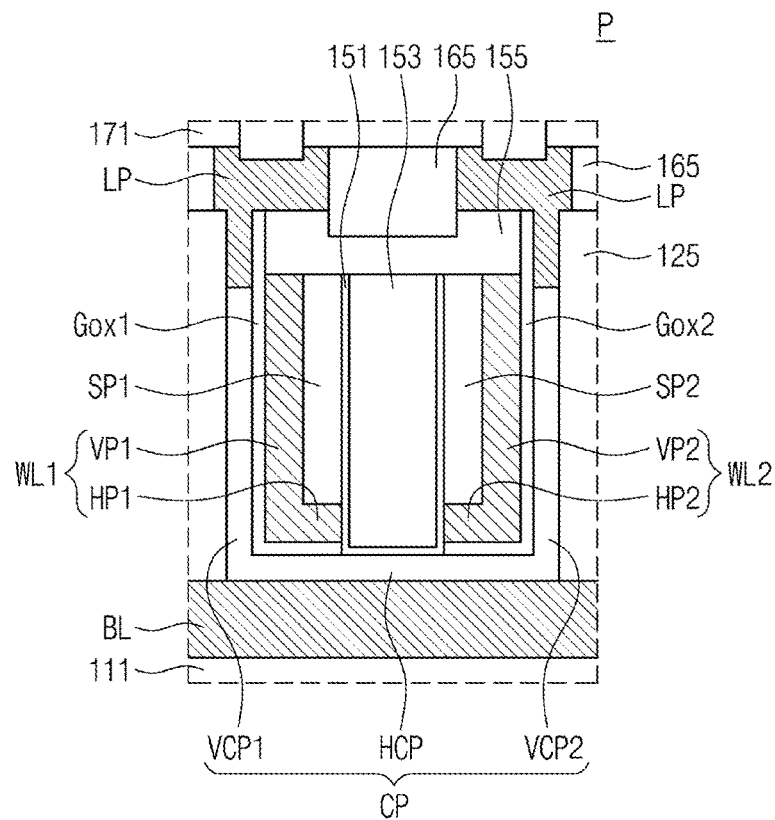

In the embodiment of FIG. 6D, the first word line WL1 may include a first horizontal portion HP1, which is disposed on the horizontal channel portion HCP of the channel pattern CP, and the first vertical portion VP1, which is vertically extended from the first horizontal portion HP1. The first vertical portion VP1 of the first word line WL1 may be adjacent to the inner side surface of the first vertical channel portion VCP1 of the channel pattern CP.

The second word line WL2 may include a second horizontal portion HP2, which is disposed on the horizontal channel portion HCP of the channel pattern CP, and a second vertical portion VP2, which is vertically extended from the second horizontal portion HP2. The second vertical portion VP2 of the second word line WL2 may be adjacent to the inner side surface of the second vertical channel portion VCP2 of the channel pattern CP.

A pair of the first and second word lines WL1 and WL2 may be disposed to be symmetric with respect to each other, on the horizontal channel portion HCP of the channel pattern CP.

A first spacer SP1 may be disposed on the first horizontal portion HP1 of the first word line WL1, and a second spacer SP2 may be disposed on the second horizontal portion HP2 of the second word line WL2. The first spacer SP1 may be aligned, e.g., coplanar, with a side surface of the first horizontal portion HP1 of the first word line WL1, and the second spacer SP2 may be aligned, e.g., coplanar, with a side surface of the second horizontal portion HP2 of the second word line WL2. In addition, the first capping pattern 151 and the second insulating pattern 153 may be disposed between a pair of the first and second spacers SP1 and SP2.

Referring back to FIGS. 3, 4A, and 4B, landing pads LP may be disposed on the first and second vertical channel portions VCP1 and VCP2 of the channel pattern CP. The landing pads LP may be in direct contact with the first and second vertical channel portions VCP1 and VCP2. The landing pad LP may include a portion that is interposed between the side surface of the mold insulating pattern 125 and the side surface of the gate insulating pattern Gox1 or Gox2, as shown in FIG. 6A. The landing pads LP may have various shapes, e.g., circular, elliptical, rectangular, square, diamond, hexagonal shapes, when viewed in a plan view. The landing pads LP may be disposed to be spaced apart from each other in the first and fourth directions D1 and D4, as shown in FIG. 3. The landing pads LP may be formed of or include at least one of, e.g., doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof.

A third insulating pattern 165 may be provided to fill a region between the landing pads LP. In other words, the landing pads LP may be separated from each other by the third insulating pattern 165.

In an embodiment, the data storage patterns DSP may be disposed on the landing pads LP, respectively. The data storage patterns DSP may be electrically connected to the first and second vertical channel portions VCP1 and VCP2 of the channel patterns CP, respectively, through the landing pads LP. The data storage patterns DSP may be disposed to be spaced apart from each other in the first and fourth directions D1 and D4, as shown in FIG. 3.

In an embodiment, the data storage pattern DSP may be a capacitor and may include bottom and top electrodes and a capacitor dielectric layer therebetween. In this case, the bottom electrode may be in contact with the landing pad LP and may have various shapes (e.g., circular, elliptical, rectangular, square, lozenge, and hexagonal shapes), when viewed in a plan view.

Alternatively, the data storage patterns DSP may be a variable resistance pattern whose resistance can be switched to one of at least two states by an electric pulse applied to a memory element. For example, the data storage patterns DSP may be formed of or include at least one of phase-change materials whose crystal state can be changed depending on an amount of a current applied thereto, perovskite compounds, transition metal oxides, magnetic materials, ferromagnetic materials, or antiferromagnetic materials.

Furthermore, upper conductive patterns UCP may be disposed on the mold insulating pattern 125 of the peripheral circuit region PCR and may be formed of or include the same conductive material as the landing pads LP. The upper conductive patterns UCP may be connected to the lower conductive patterns LCP through lower conductive vias LVP.

An etch stop layer 171 may be provided to cover top surfaces of the landing pads LP and the upper conductive patterns UCP, and a fourth insulating layer 173 may be provided on the etch stop layer 171. The fourth insulating layer 173 may cover the data storage patterns DSP of the cell array region CAR. Connection lines CL may be provided on the fourth insulating layer 173 in the peripheral circuit region PCR, and the connection lines CL may be connected to the upper conductive patterns UCP through upper conductive vias UVP.

Hereinafter, semiconductor devices according to some embodiments will be described. In the following description, a previously described element may be identified by the same reference number without repeating an overlapping description thereof, for the sake of brevity.

Figure 7:
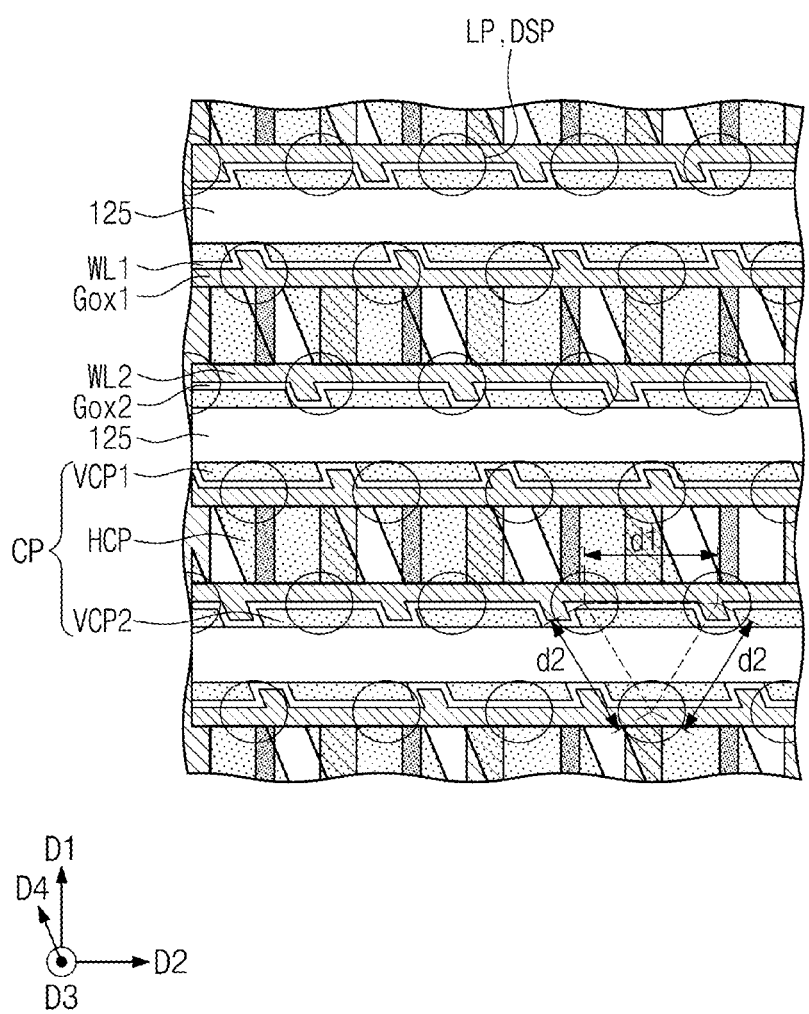
FIG. 7 is a plan view illustrating a semiconductor memory device according to an embodiment.

FIG. 7 is a plan view illustrating a semiconductor memory device according to an embodiment.

The data storage patterns DSP may be fully or partially overlapped with the landing pads LP. Each of the data storage patterns DSP may be in contact with the entire or partial region of the top surface of a corresponding one of the landing pads LP.

In an embodiment, the first and second vertical channel portions VCP1 and VCP2 of the channel patterns CP may be arranged in a zigzag shape in the first or second direction D1 or D2, when viewed in a plan view. The landing pads LP and the data storage patterns DSP may also be arranged in zigzag or honeycomb shape in the first or second direction D1 or D2, when viewed in a plan view.

In detail, the data storage patterns DSP or the landing pads LP may be arranged to be spaced apart from each other by substantially the same distance in the second direction D2 and the fourth direction D4. In other words, a distance d1 between centers of two data storage patterns DSP, which are adjacent to each other in the second direction D2 may be substantially equal to a distance d2 between centers of two data storage patterns DSP, which are adjacent to each other in the fourth direction D4 (i.e., a diagonal direction).

Figure 8:
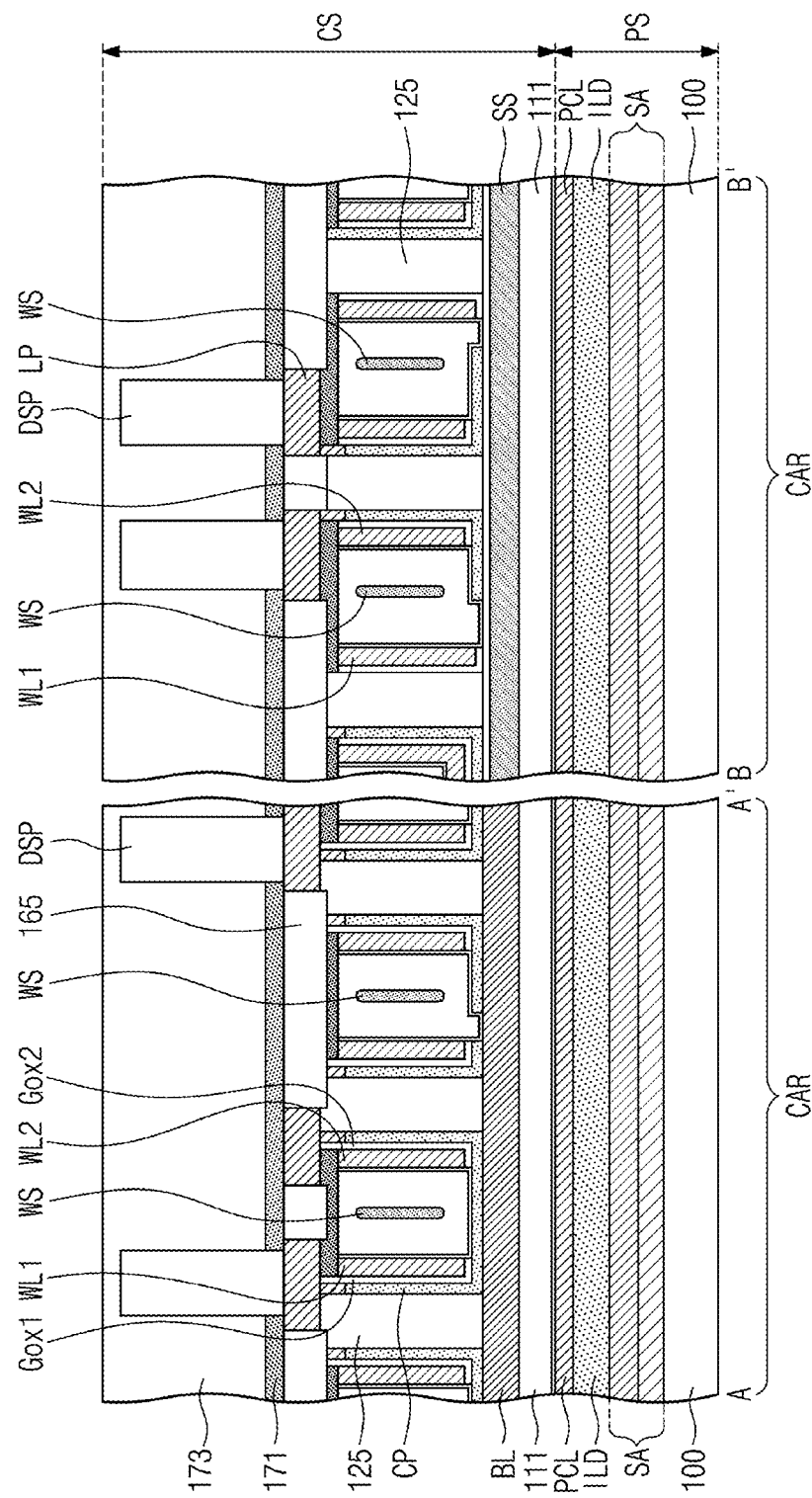
FIG. 8 is a sectional view illustrating cross-sections taken along lines A-A' and B-B' of FIG. 3.

FIG. 8 is a sectional view illustrating cross-sections taken along the lines A-A' and B-B' of FIG. 3.

In the embodiment shown in FIG. 8, the semiconductor memory device may include word-line shielding structures WS or air gaps, each of which is provided between a corresponding pair of the first and second word lines WL1 and WL2. The word-line shielding structures WS may be extended in the second direction D2 to be parallel to the first and second word lines WL1 and WL2.

The word-line shielding structures WS may be formed by forming an insulating layer to define gap regions, when the second insulating patterns 153 are formed after the formation of the first and second word lines WL1 and WL2, and filling the gap region of the insulating layer with a conductive material. In this case, the word-line shielding structures WS may be locally formed in the second insulating patterns 153. Alternatively, the air gaps may be formed in the second insulating pattern 153 by depositing an insulating layer using a deposition method having a poor step coverage property when the second insulating patterns 153 are formed.

Figure 9:
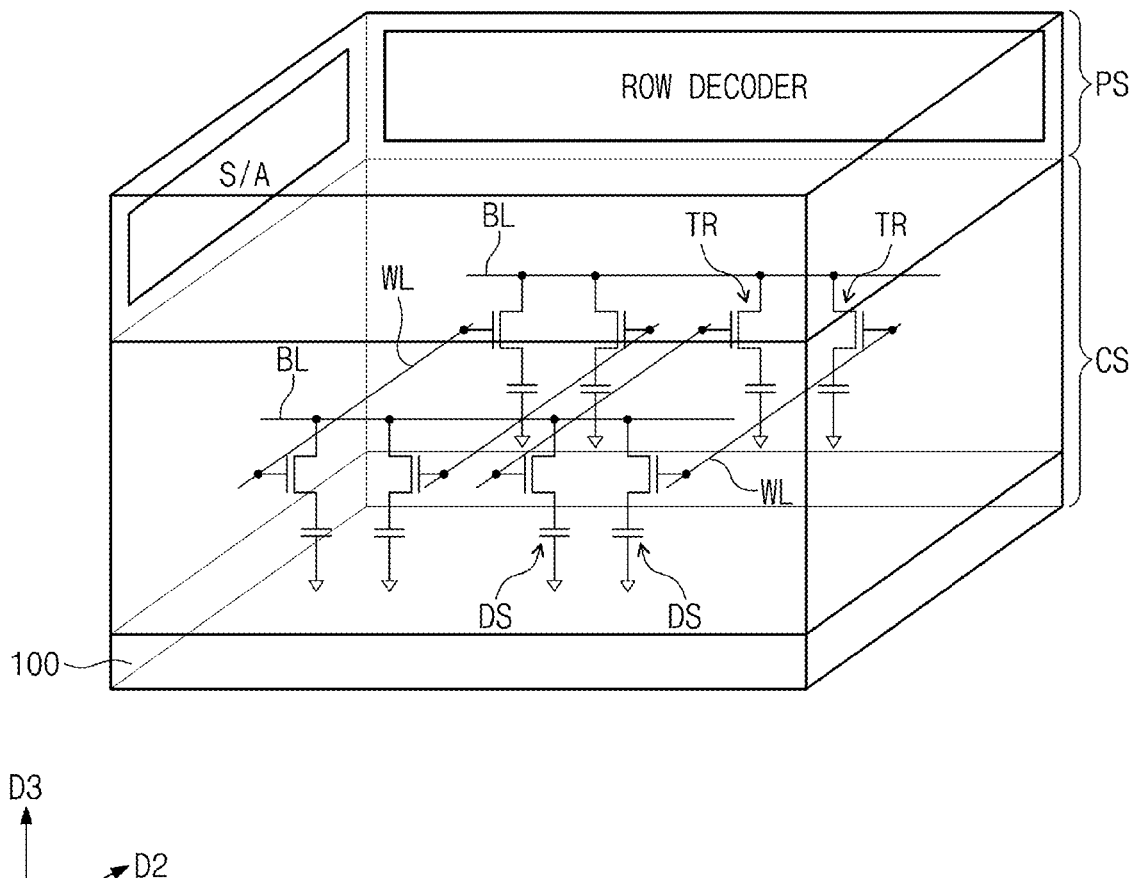
FIG. 9 is a perspective view schematically illustrating a semiconductor memory device according to an embodiment.

FIG. 9 is a perspective view schematically illustrating a semiconductor memory device according to an embodiment.

Referring to FIG. 9, the semiconductor memory device may include the cell array structure CS on the semiconductor substrate 100 and the peripheral circuit structure PS on the cell array structure CS.

In an embodiment, the cell array structure CS may be provided between the semiconductor substrate 100 and the peripheral circuit structure PS, in the third direction D3 perpendicular to the top surface of the semiconductor substrate 100. The cell array structure CS may include the bit lines BL, the word lines WL, and memory cells therebetween, as described above. Each of the memory cells may include a vertical channel transistor, which is used as the selection element TR (e.g., see FIG. 1), and a capacitor, which is used as the data storage element DS (e.g., see FIG. 1). The peripheral circuit structure PS may include core and peripheral circuits, which are formed on a semiconductor layer provided on an insulating layer.

Figure 10A:
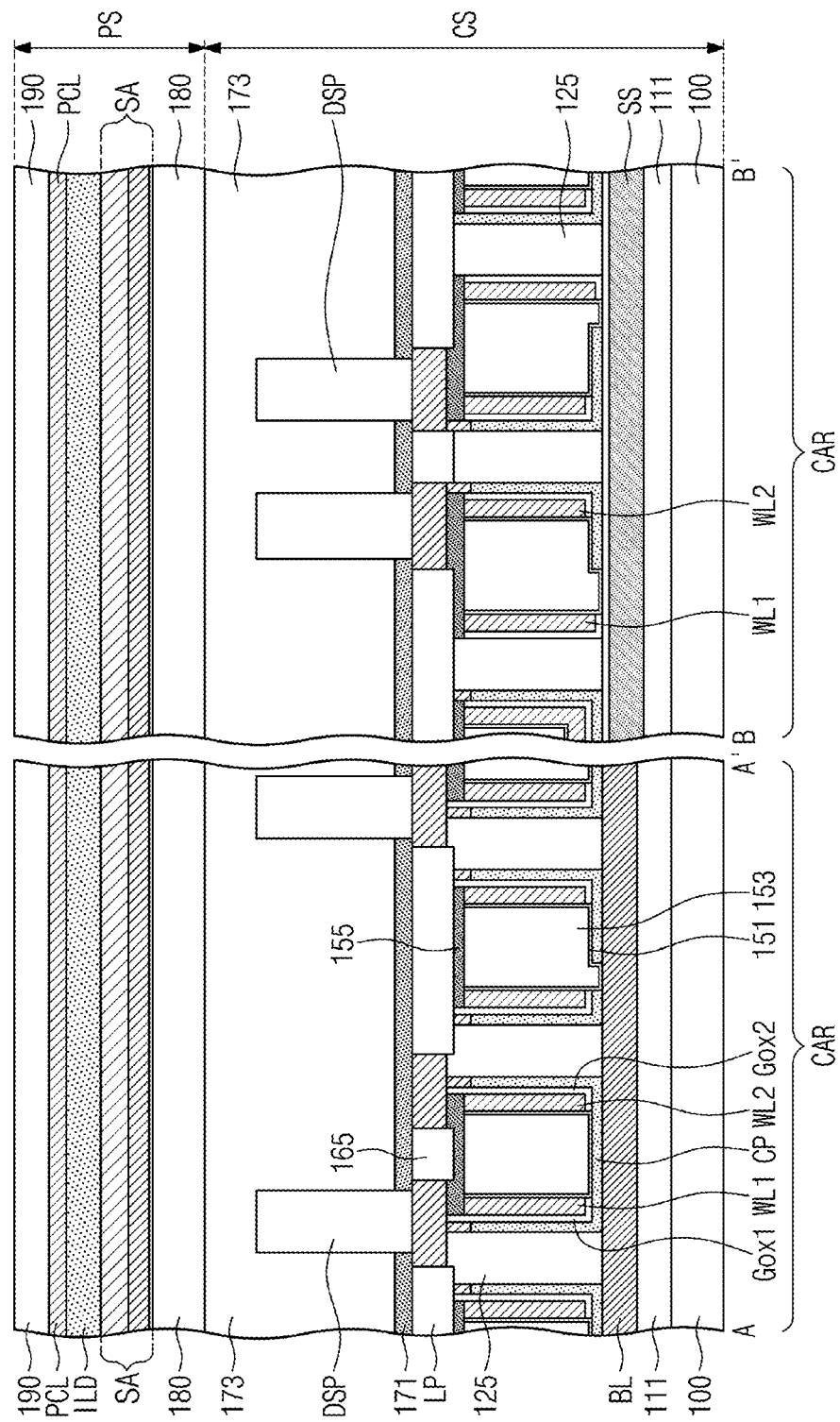
FIGS. 10A and 10B are sectional views illustrating cross-sections taken along lines A-A', B-B', C-C', D-D', and E-E' of FIG. 3.
Figure 10B:
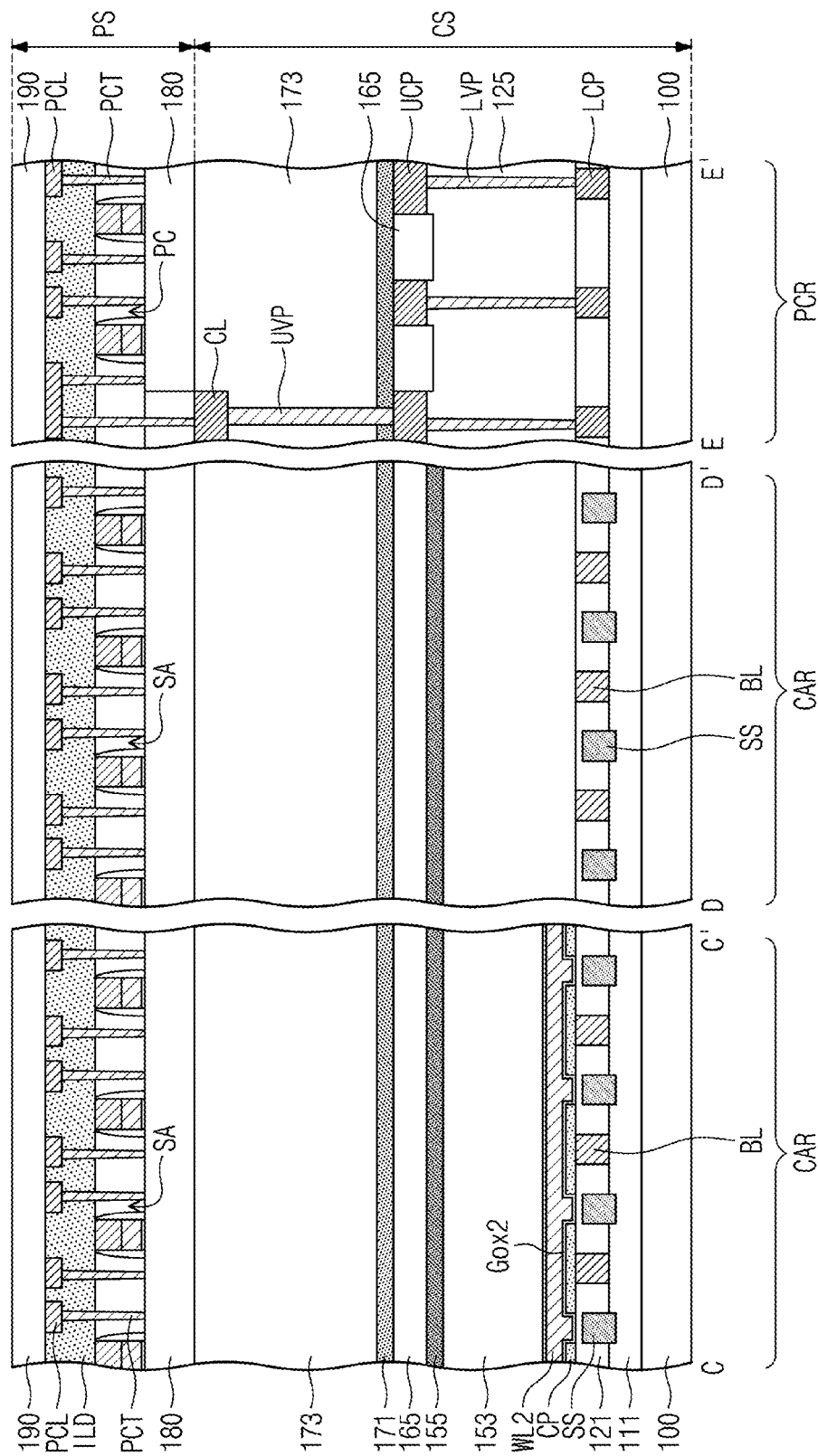

FIGS. 10A and 10B are sectional views illustrating cross-sections taken along the lines A-A', B-B', C-C', D-D', and E-E' of FIG. 3 (to reflect the structure of FIG. 9).

Referring to FIGS. 3, 10A, and 10B, the cell array structure CS may include the bit lines BL, the first and second word lines WL1 and WL2, the channel patterns CP, the data storage patterns DSP, and lower metal pads LMP, which are disposed on the lower insulating pattern 111 covering the semiconductor substrate 100.

The bit lines BL may be disposed on the lower insulating pattern 111 covering the semiconductor substrate 100. The bit lines BL may be extended in the first direction D1 and may be spaced apart from each other in the second direction D2. The shielding structures SS may be provided between the bit lines BL.

The first and second word lines WL1 and WL2, the channel patterns CP, and the data storage patterns DSP may be configured to have substantially the same technical features as those in the embodiments described with reference to FIGS. 3, 4A, 4B, and 6A to 6D.

A semiconductor layer 180 may be disposed on the fourth insulating layer 173 of the cell array structure CS. The semiconductor layer 180 may be a single- or poly-crystalline silicon layer. The peripheral circuit insulating layer ILD, the peripheral contact plugs PCT, and the peripheral circuit lines PCL may be provided on the semiconductor layer 180, and here, the peripheral circuit insulating layer ILD may be provided to cover the core and peripheral circuits SA and PC.

The peripheral circuit lines PCL may be coupled to the connection lines CL through the peripheral contact plugs PCT, which are formed to penetrate the peripheral circuit insulating layer ILD and the semiconductor layer 180. The peripheral contact plug PCT penetrating the semiconductor layer 180 may be surrounded by an insulating material. An uppermost insulating layer 190 may be provided to cover top surfaces of the peripheral circuit lines PCL.

Figure 11:
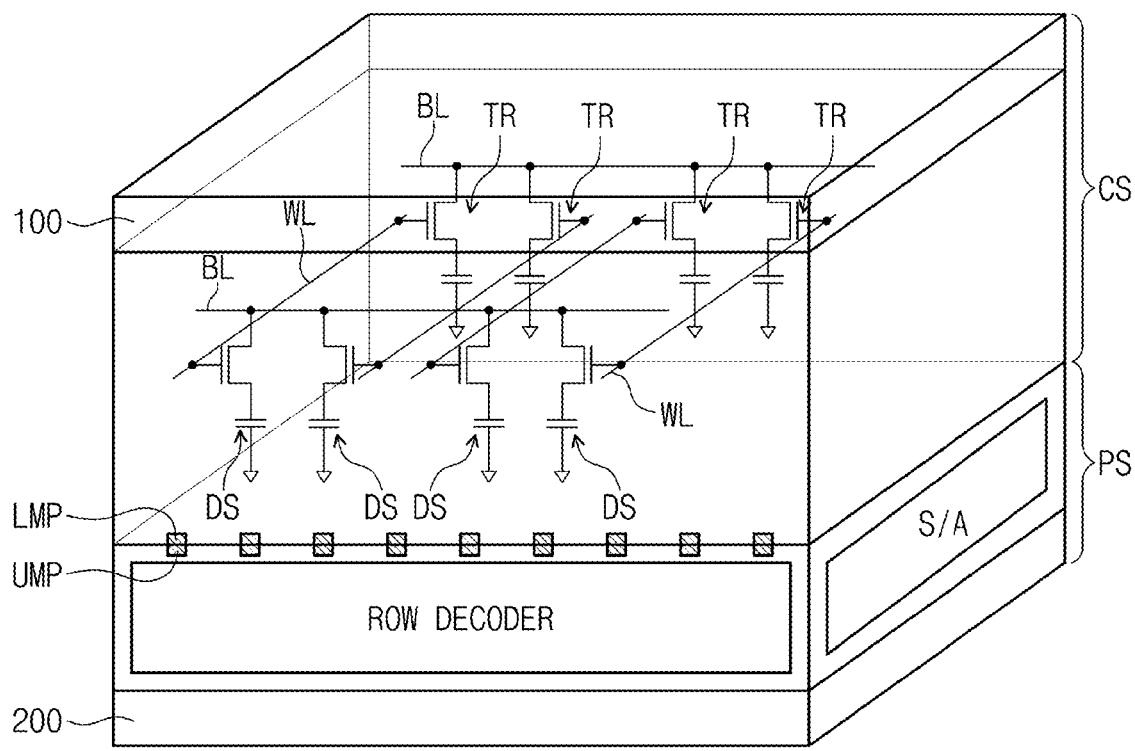
FIG. 11 is a perspective view schematically illustrating a semiconductor memory device according to an embodiment.

FIG. 11 is a perspective view schematically illustrating a semiconductor memory device according to an embodiment.

Referring to FIG. 11, the semiconductor memory device may have a chip-to-chip (C2C) structure. In the C2C structure, an upper chip including the cell array structure CS may be fabricated on a first semiconductor substrate 100, e.g., a first wafer, a lower chip including the peripheral circuit structure PS may be fabricated on a second semiconductor substrate 200, e.g., a second wafer, which is different from the first semiconductor substrate 100, and then, the upper and lower chips may be connected to each other through a bonding process. Here, the bonding process may be performed to electrically connect a bonding metal pad, which is formed in the uppermost metal layer of the upper chip, to a bonding metal pad, which is formed in the uppermost metal layer of the lower chip. For example, in the case where the bonding metal pad is formed of copper (Cu), the bonding process may be performed in a Cu-to-Cu bonding manner, but in an embodiment, the bonding metal pad may also be formed of or include, e.g., aluminum (Al) or tungsten (W).

The cell array structure CS may be provided on the first semiconductor substrate 100, and the lower metal pads LMP may be provided in the uppermost layer of the cell array structure CS (e.g., relative to the first semiconductor substrate 100). The lower metal pads LMP may be electrically connected to the memory cell array 1 (e.g., see FIG. 1).

The peripheral circuit structure PS may be provided on the second semiconductor substrate 200, and upper metal pads UMP may be provided in the uppermost layer of the peripheral circuit structure PS (e.g., relative to the second semiconductor substrate 200). The upper metal pads UMP may be electrically connected to the core and peripheral circuits 2, 3, 4, and 5 (e.g., see FIG. 1). The upper metal pads UMP may be directly bonded to the lower metal pads LMP of the cell array structure CS and may be in direct contact with the lower metal pads LMP. That is, as illustrated in FIG. 10, the uppermost layers of the cell array structure CS and the peripheral circuit structure PS may be connected to each other via the upper metal pads UMP and the lower metal pads LMP, e.g., the combined upper metal pads UMP and lower metal pads LMP may be between the first and second semiconductor substrate 100 and 200.

Figure 12A:
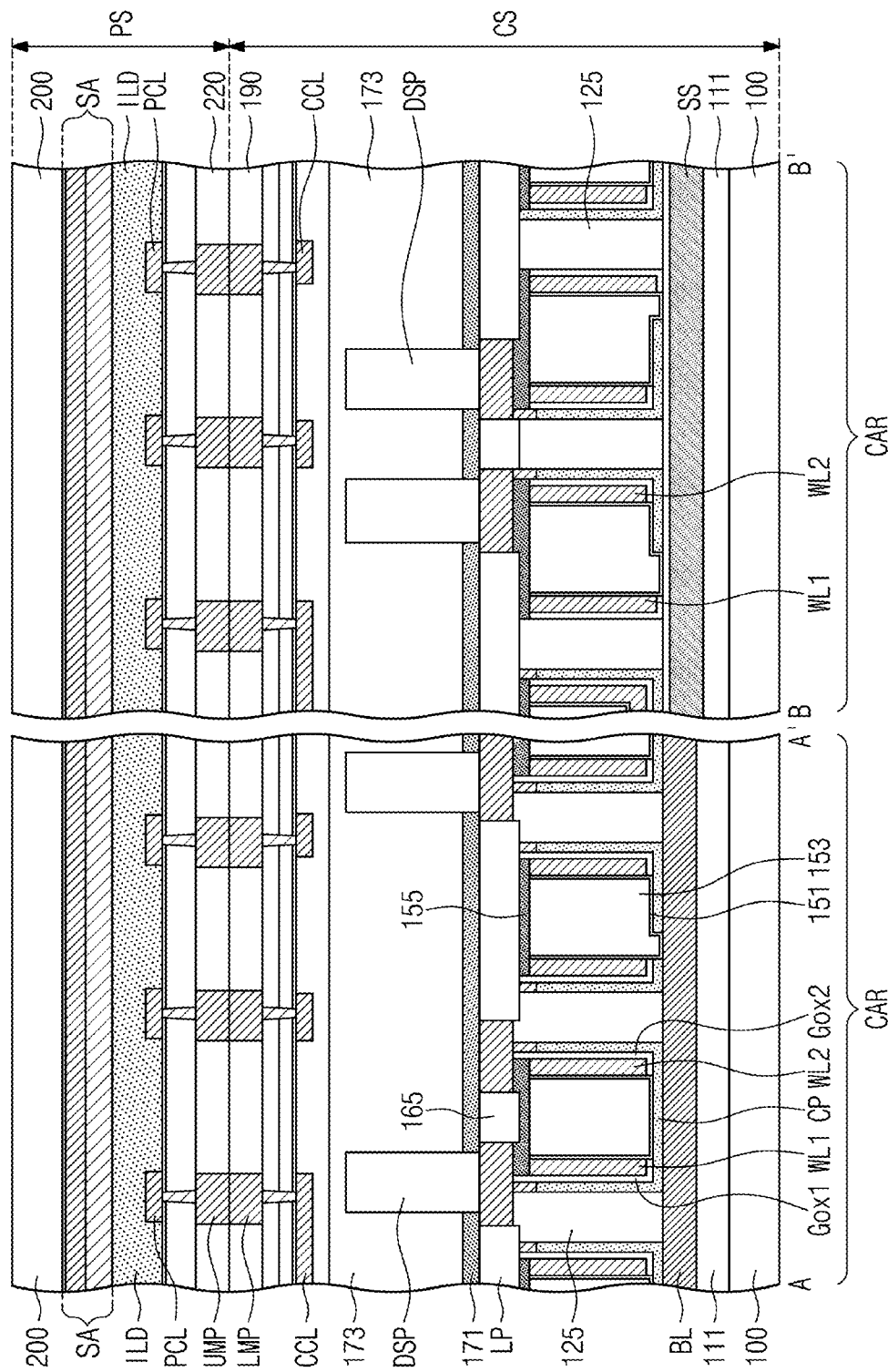
FIGS. 12A and 12B are sectional views illustrating cross-sections taken along lines A-A', B-B', C-C', and D-D' of FIG. 3.
Figure 12B:
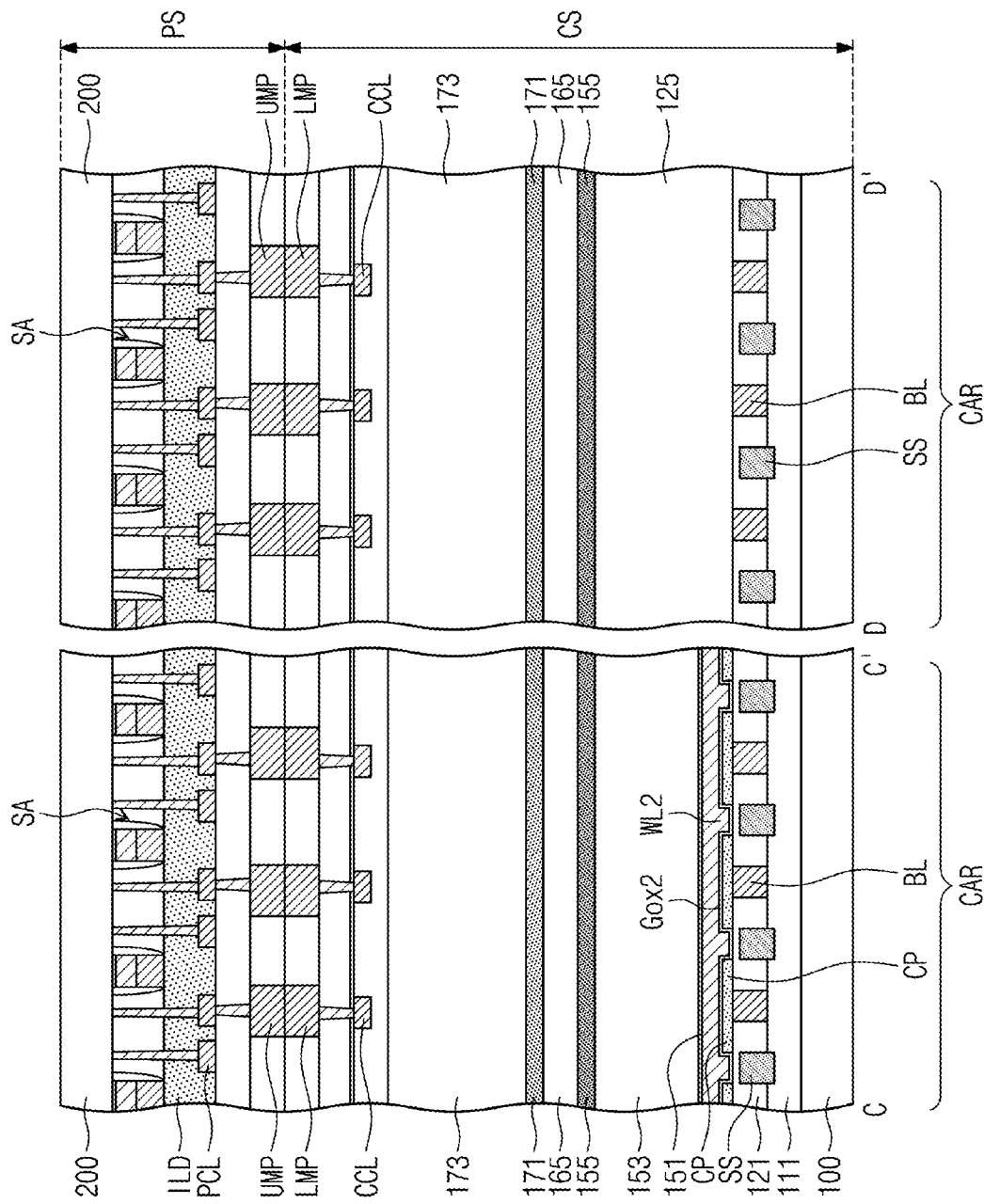

FIGS. 12A and 12B are sectional views illustrating cross-sections taken along the lines A-A', B-B', C-C', and D-D' of FIG. 3 (to reflect the structure of FIG. 11).

Referring to FIGS. 3, 12A, and 12B, the semiconductor memory device may include the cell array structure CS, which includes the lower metal pads LMP provided at its uppermost level, and the peripheral circuit structure PS, which includes the upper metal pads UMP provided at its uppermost level. Here, the lower metal pads LMP of the cell array structure CS and the upper metal pads UMP of the peripheral circuit structure PS may be electrically and physically connected to each other in a bonding manner. The lower and upper metal pads LMP and UMP may be formed of or include at least one of metallic materials (e.g., copper (Cu)). In other words, the lower metal pads LMP may be in direct contact with the upper metal pads UMP.

In detail, the cell array structure CS may include the bit lines BL, the first and second word lines WL1 and WL2, the channel patterns CP, the data storage patterns DSP, and the lower metal pads LMP, which are disposed on the lower insulating pattern 111 covering the semiconductor substrate 100. The bit lines BL, the first and second word lines WL1 and WL2, the channel patterns CP, and the data storage patterns DSP may be configured to have substantially the same technical features as those in the embodiments described with reference to FIGS. 3, 4A, 4B, and 6A to 6D.

Cell metal structures CCL may be provided on the fourth insulating layer 173 covering the data storage patterns DSP, and in this case, the cell metal structures CCL may be electrically connected to the bit lines BL and the first and second word lines WL1 and WL2. The lower metal pads LMP may be disposed in the uppermost layer (e.g., the uppermost insulating layer 190) of the cell array structure CS.

The peripheral circuit structure PS may include the core and peripheral circuits SA and PC, which are integrated on the second semiconductor substrate 200, the peripheral circuit contact plugs PCT and the peripheral circuit lines PCL, which are electrically connected to the core and peripheral circuits SA, and the upper metal pads UMP, which are electrically connected to the peripheral circuit lines PCL. The upper metal pads UMP may be disposed in the uppermost layer (e.g., a peripheral insulating layer 220) of the peripheral circuit structure PS.

The lower and upper metal pads LMP and UMP may have substantially the same size and arrangement. The lower and upper metal pads LMP and UMP may be formed of or include at least one of, e.g., copper (Cu), aluminum (Al), nickel (Ni), cobalt (Co), tungsten (W), titanium (Ti), tin (Sn), or alloys thereof.

FIGS. 13A to 20A are plan views illustrating stages in a method of fabricating a semiconductor memory device, according to an embodiment. FIGS. 12B to 20B, 12C to 20C, 21A to 23A, and 21B to 23B are sectional views illustrating stages in a method of fabricating a semiconductor memory device, according to an embodiment.

Figure 13A:
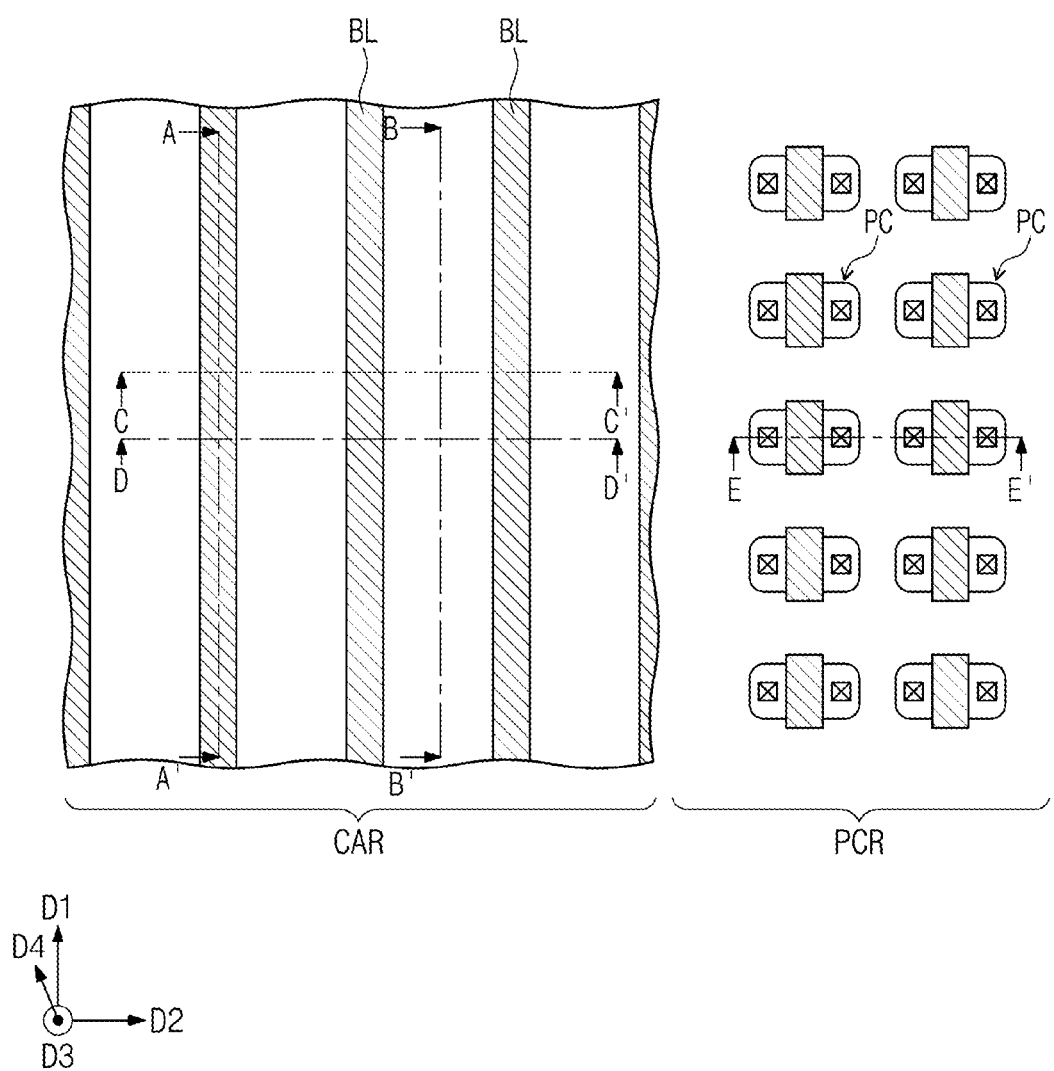
Figure 13B:
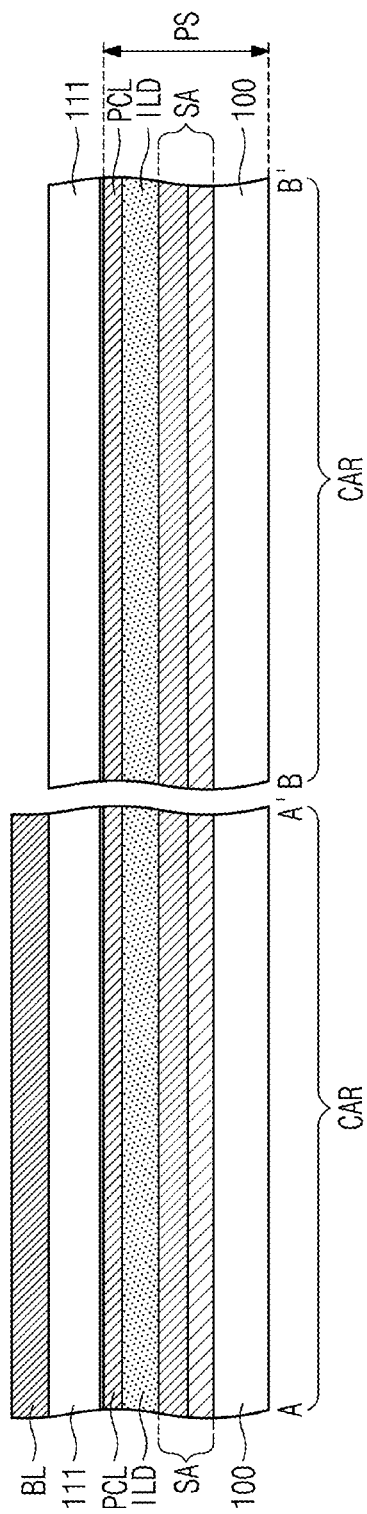
Figure 13C:
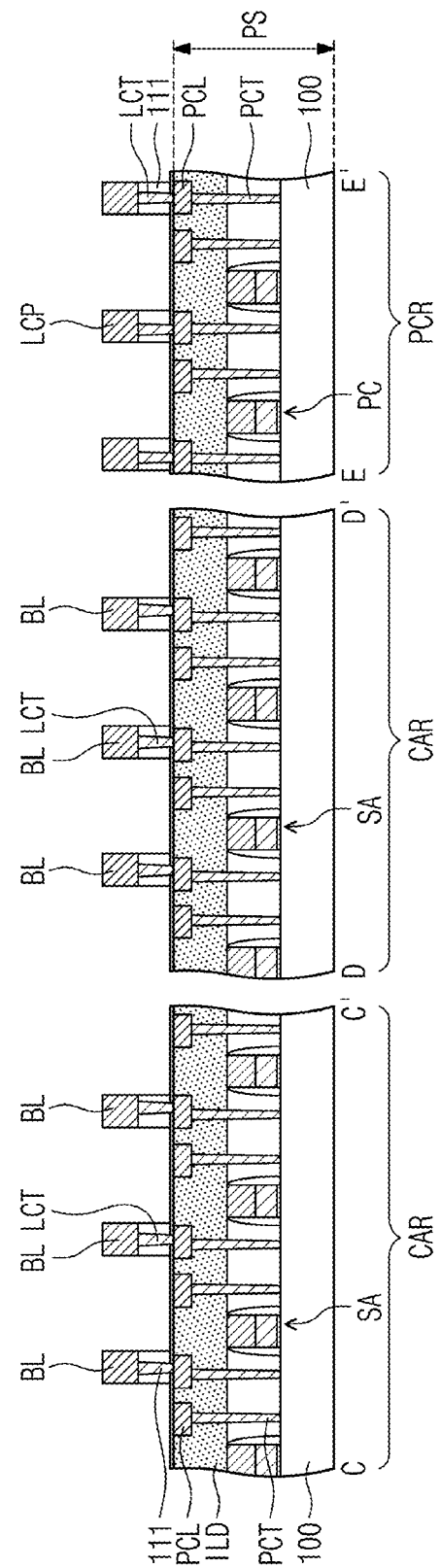

Referring to FIGS. 13A, 13B, and 13C, the peripheral circuit structure PS including the core and peripheral circuits SA and PC may be formed on the semiconductor substrate 100.

The semiconductor substrate 100 may include the cell array region CAR and the peripheral circuit region PCR. The core circuit SA including the sense amplifier 3 (e.g., see FIG. 1) may be formed on the cell array region CAR of the semiconductor substrate 100. The peripheral circuit PC, e.g., the word line driver and the control logic 5 (e.g., see FIG. 1), may be formed on the peripheral circuit region PCR of the semiconductor substrate 100. The core and peripheral circuits SA and PC may include NMOS and PMOS transistors, which are integrated on the semiconductor substrate 100.

The peripheral circuit insulating layer ILD may be formed on the semiconductor substrate 100 to cover the core and peripheral circuits SA and PC. The peripheral circuit insulating layer ILD may include a plurality of vertically-stacked insulating layers. In an embodiment, the peripheral circuit insulating layer ILD may include, e.g., a silicon oxide layer, a silicon nitride layer, a silicon oxynitride layer, and/or a low-k dielectric layer.

The peripheral contact plugs PCT and the peripheral circuit lines PCL may be formed in the peripheral circuit insulating layer ILD. The peripheral contact plugs PCT and the peripheral circuit lines PCL may be electrically connected to the core and peripheral circuits SA and PC.

The bit lines BL may be formed in the cell array region CAR and on the peripheral circuit insulating layer ILD. The bit lines BL may be extended in the first direction D1 and may be spaced apart from each other in the second direction D2.

The formation of the bit lines BL may include forming a lower insulating layer on the semiconductor substrate 100 to cover the peripheral circuit insulating layer ILD, forming the lower contact plugs LCT to penetrate the lower insulating layer and to be connected to the peripheral circuit structure PS or the peripheral circuit lines PCL, depositing a lower conductive layer on the lower insulating layer, and patterning the lower conductive layer and the lower insulating layer to form the bit lines BL on the cell array region CAR.

During an etching process for forming the bit lines BL, the lower insulating layer may be etched to form the lower insulating pattern 111 and to expose the peripheral circuit insulating layer ILD.

During the formation of the bit lines BL, the lower conductive layer and the lower insulating layer may be patterned to form the lower conductive patterns LCP on the peripheral circuit region PCR. The lower conductive patterns LCP may be connected to the peripheral circuit PC through the lower contact plugs LCT and the peripheral circuit lines PCL.

Figure 14A:
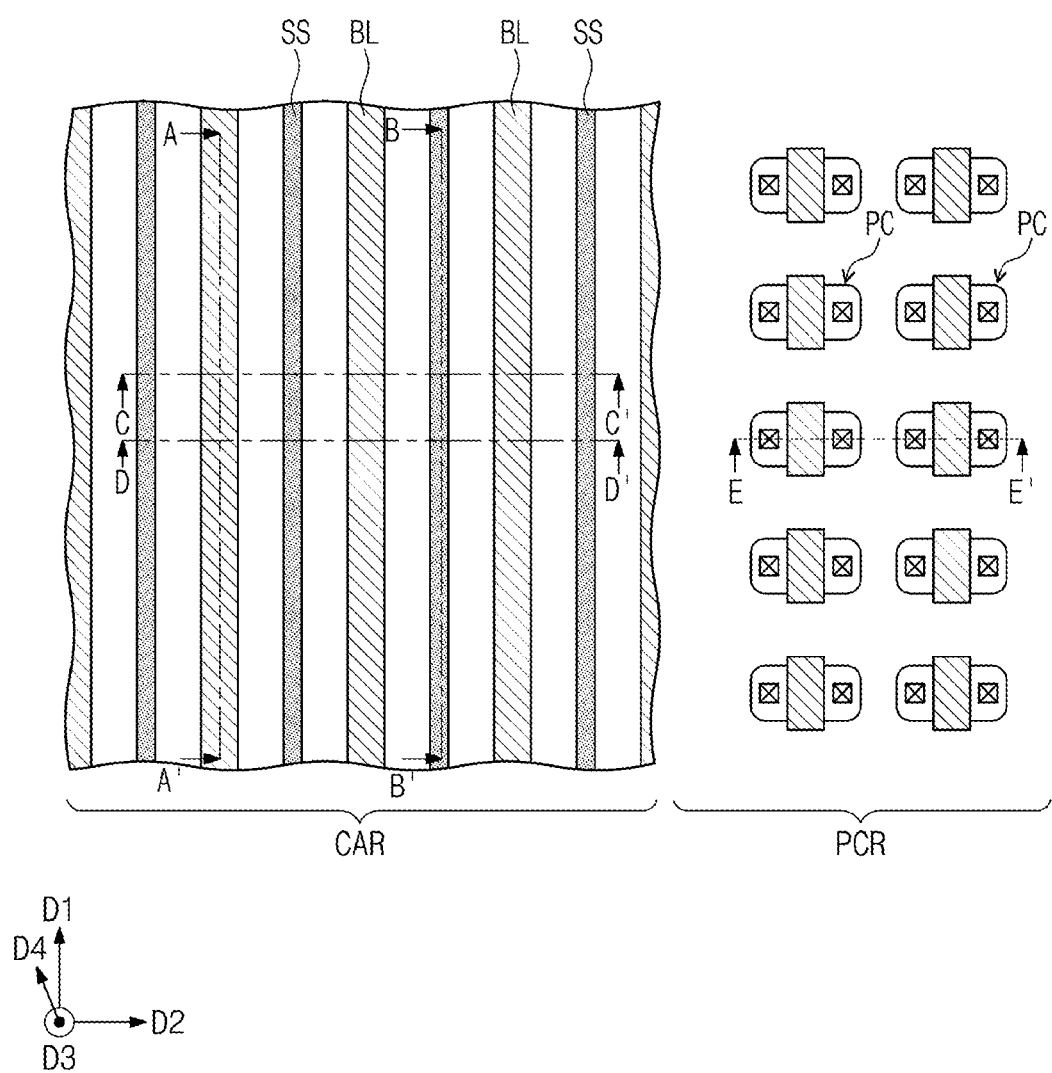
Figure 14B:
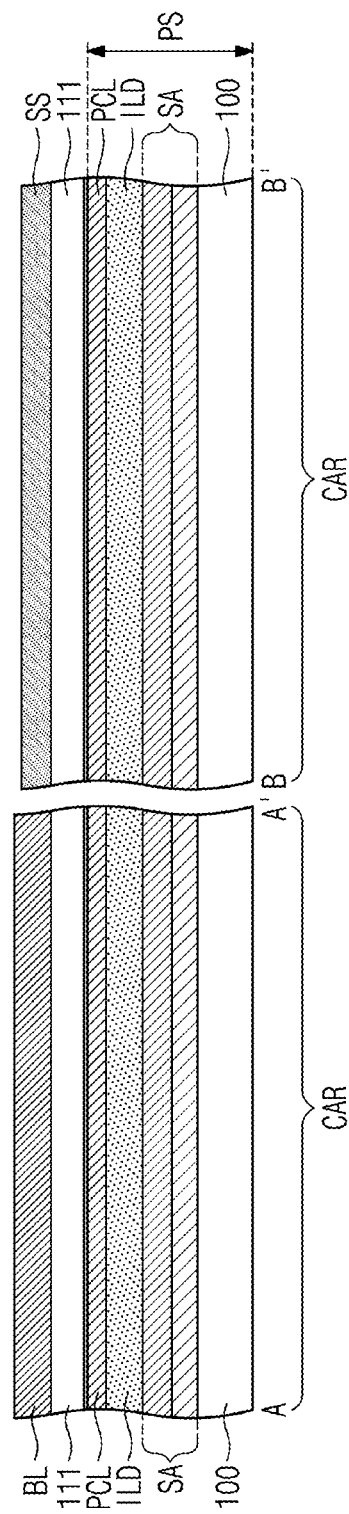
Figure 14C:
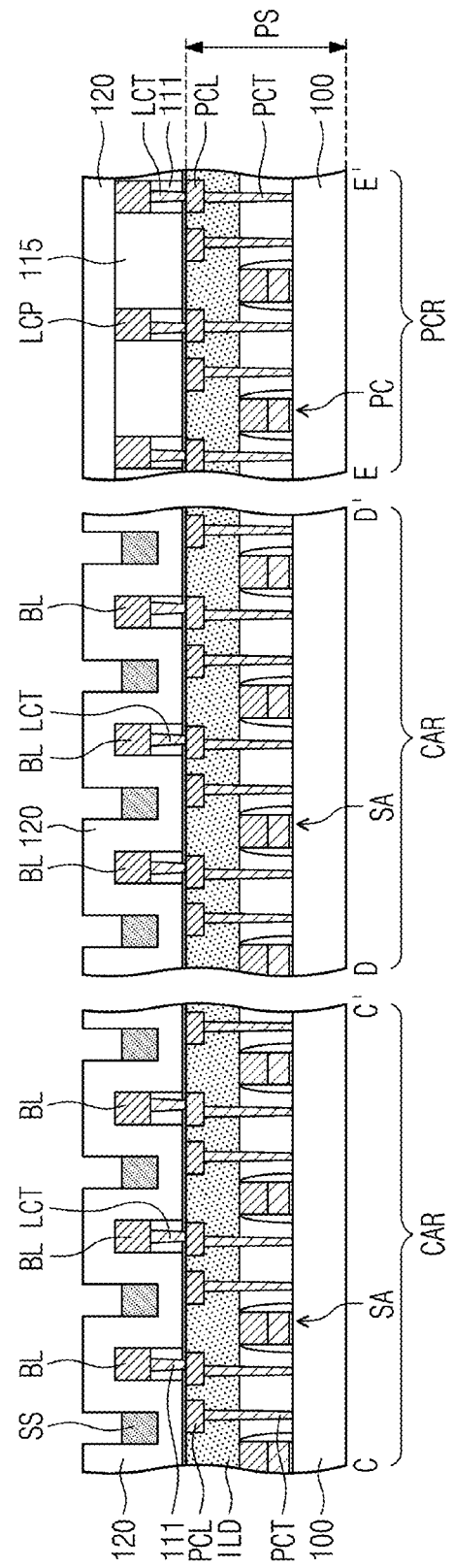

Referring to FIGS. 14A, 14B, and 14C, after the formation of the bit lines BL, a first insulating layer 120 may be formed to define gap regions between the bit lines BL.

The first insulating layer 120 may be deposited on the semiconductor substrate 100 to have a substantially uniform thickness. A deposition thickness of the first insulating layer 120 may be smaller than half a distance between adjacent ones of the bit lines BL. In the case where the first insulating layer 120 is deposited in this manner, the gap region between the bit lines BL may be defined by the first insulating layer 120. The gap region may be extended in the first direction D1 to be parallel to the bit lines BL.

Meanwhile, before the formation of the first insulating layer 120, an insulating material 115 may be formed on the peripheral circuit region PCR to fill a region between the lower conductive patterns LCP.

After the formation of the first insulating layer 120, the shielding structures SS may be formed on the first insulating layer 120 to fill the gap regions. The shielding structures SS may be formed between the bit lines BL.

The formation of the shielding structures SS may include forming a shielding layer on the first insulating layer 120 to fill the gap region and recessing a top surface of the shielding layer.

The shielding layer may be deposited on the first insulating layer 120 using a chemical vapor deposition (CVD) process, and owing to the step coverage property of the CVD process, a discontinuous interface (e.g., a seam) may be formed. Furthermore, if the CVD process has a poor step coverage property, an over-hang issue may occur, and in this case, a void or air gap may be formed in the gap region.

The shielding structures SS may be formed of or include at least one of metallic materials (e.g., tungsten (W), titanium (Ti), nickel (Ni), or cobalt (Co)). In an embodiment, the shielding structures SS may be formed of or include a conductive two-dimensional (2D) material (e.g., graphene).

In an embodiment, the process of forming the shielding structures SS may be omitted, and spaces between the bit lines BL may be filled with the first insulating layer 120. Alternatively, the first insulating layer 120 may include a plurality of air gaps which are defined between the bit lines BL.

Figure 15A:
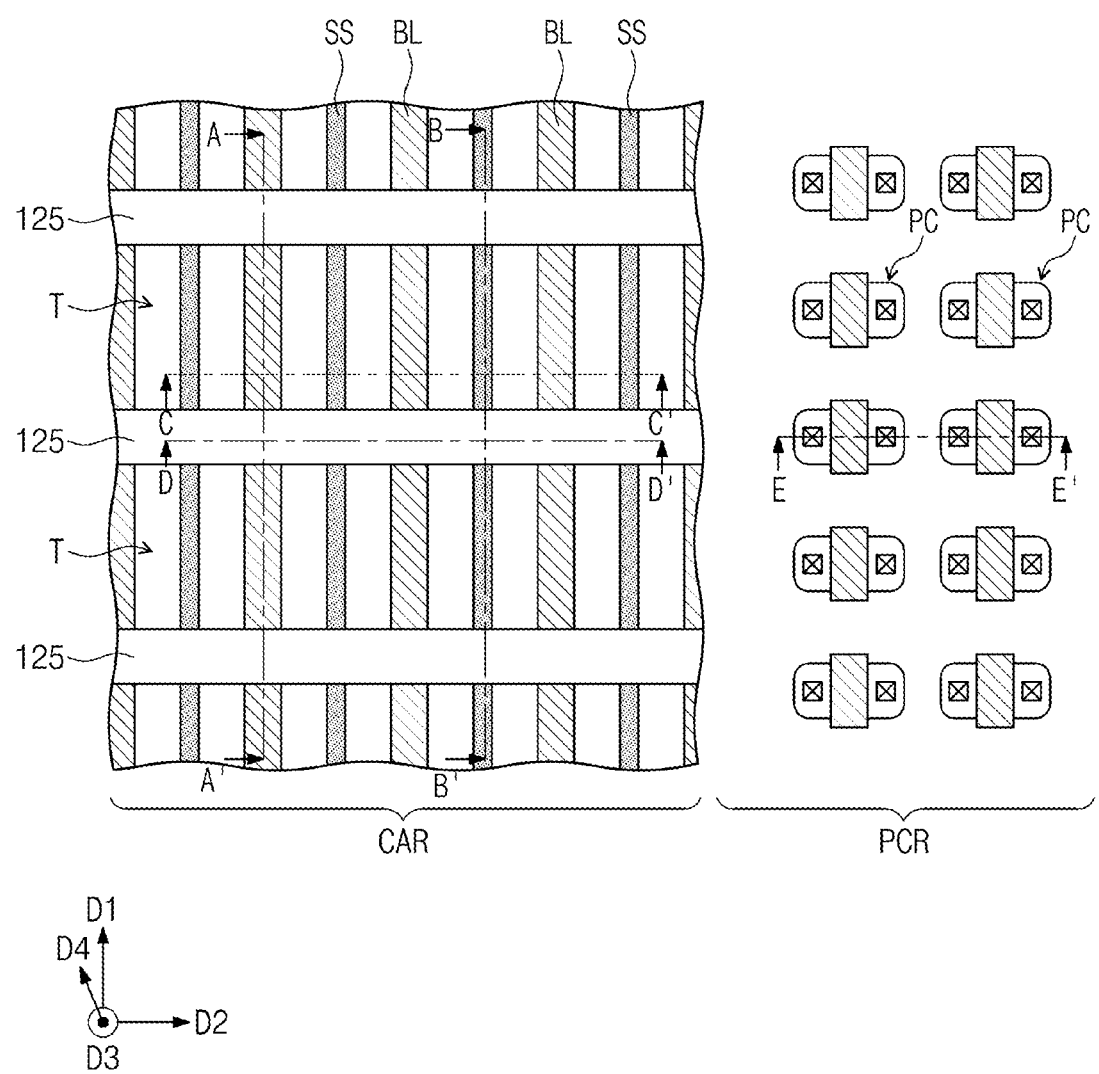
Figure 15B:
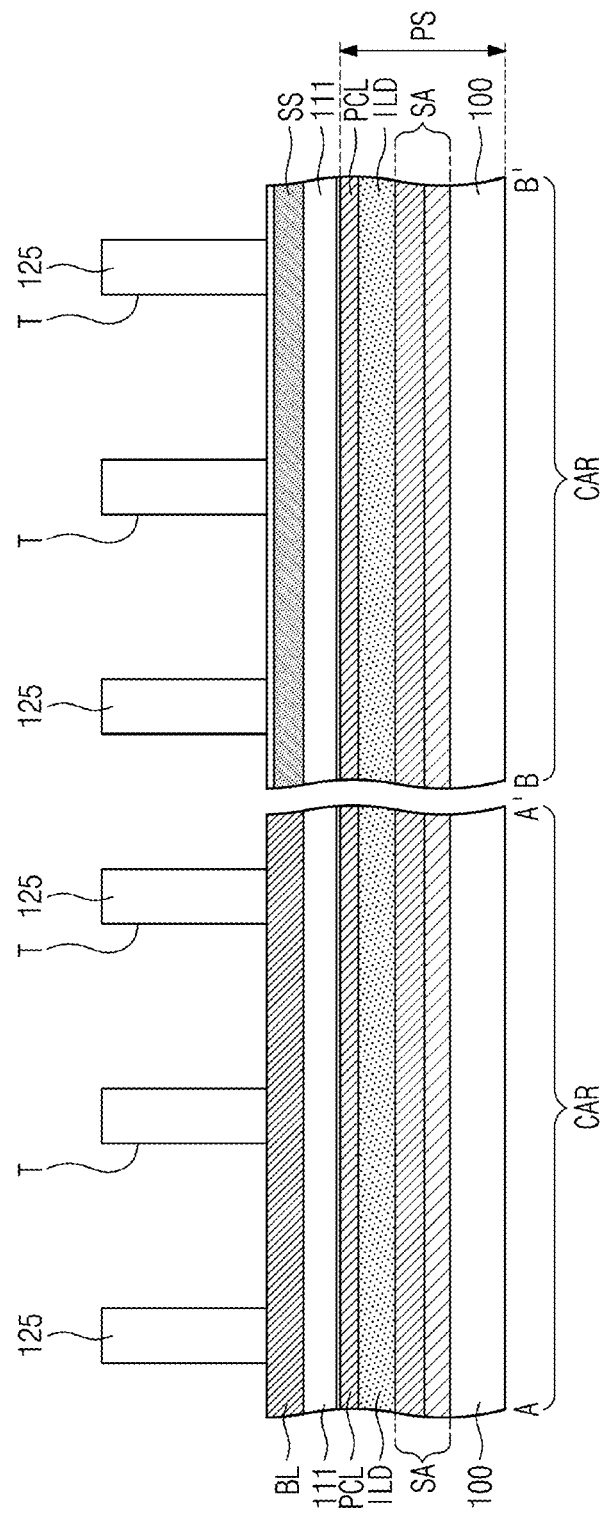
Figure 15C:
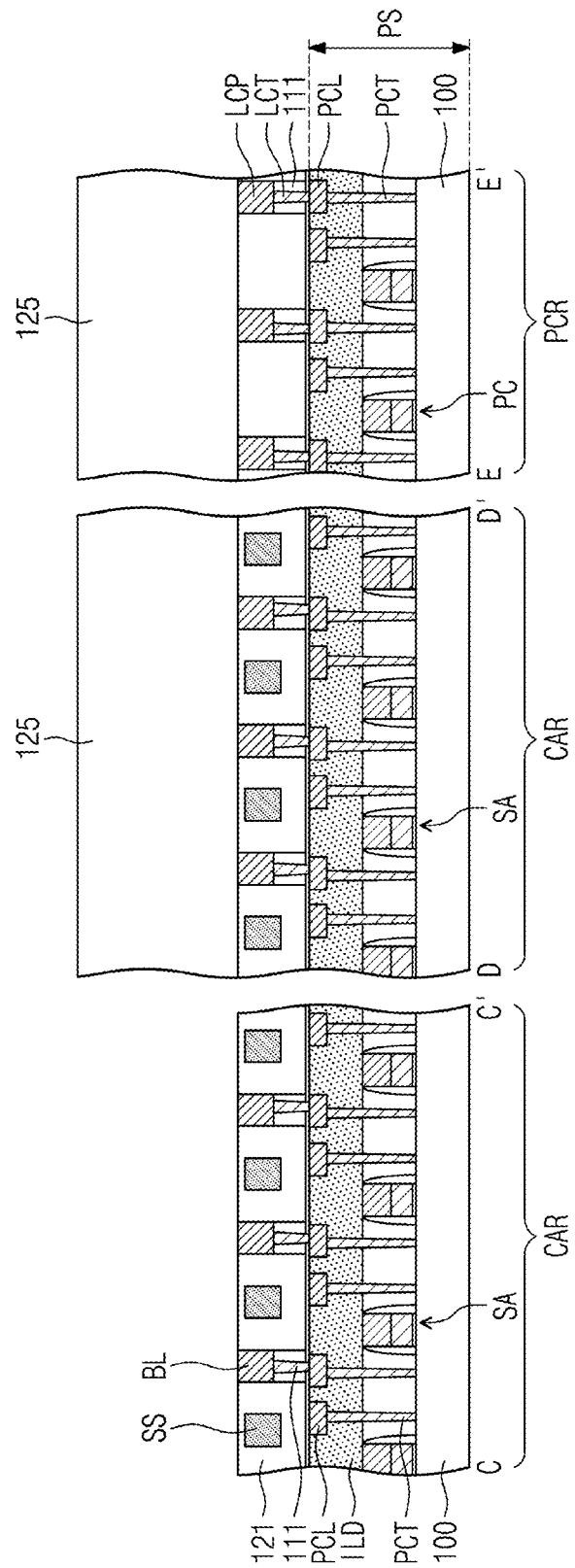

Referring to FIGS. 15A, 15B, and 15C, after the formation of the shielding structures SS, a capping insulating layer may be formed on the shielding structures SS, and a planarization process may be performed on the capping insulating layer and the first insulating layer 120 to expose the top surfaces of the bit lines BL. Accordingly, the first insulating patterns 121 may be formed between the bit lines BL and the shielding structures SS.

Next, the mold insulating pattern 125 may be formed on the first insulating patterns 121 and the bit lines BL. The mold insulating pattern 125 may define trenches T, which are extended in the second direction D2 and are spaced apart from each other in the first direction D1. The trenches T may be formed to cross the bit lines BL and to expose portions of the bit lines BL.

In an embodiment, distances between the channel patterns CP may vary depending on a width of the mold insulating pattern 125 (e.g., a distance between the trenches T). In addition, distances between the first and second word lines WL1 and WL2 may vary depending on widths of the trenches T.

The mold insulating pattern 125 may be formed of or include an insulating material having an etch selectivity with respect to the first insulating pattern 121. For example, the mold insulating pattern 125 may be formed of or include at least one of silicon oxide, silicon nitride, silicon oxynitride, and/or low-k dielectric materials.

Figure 16A:
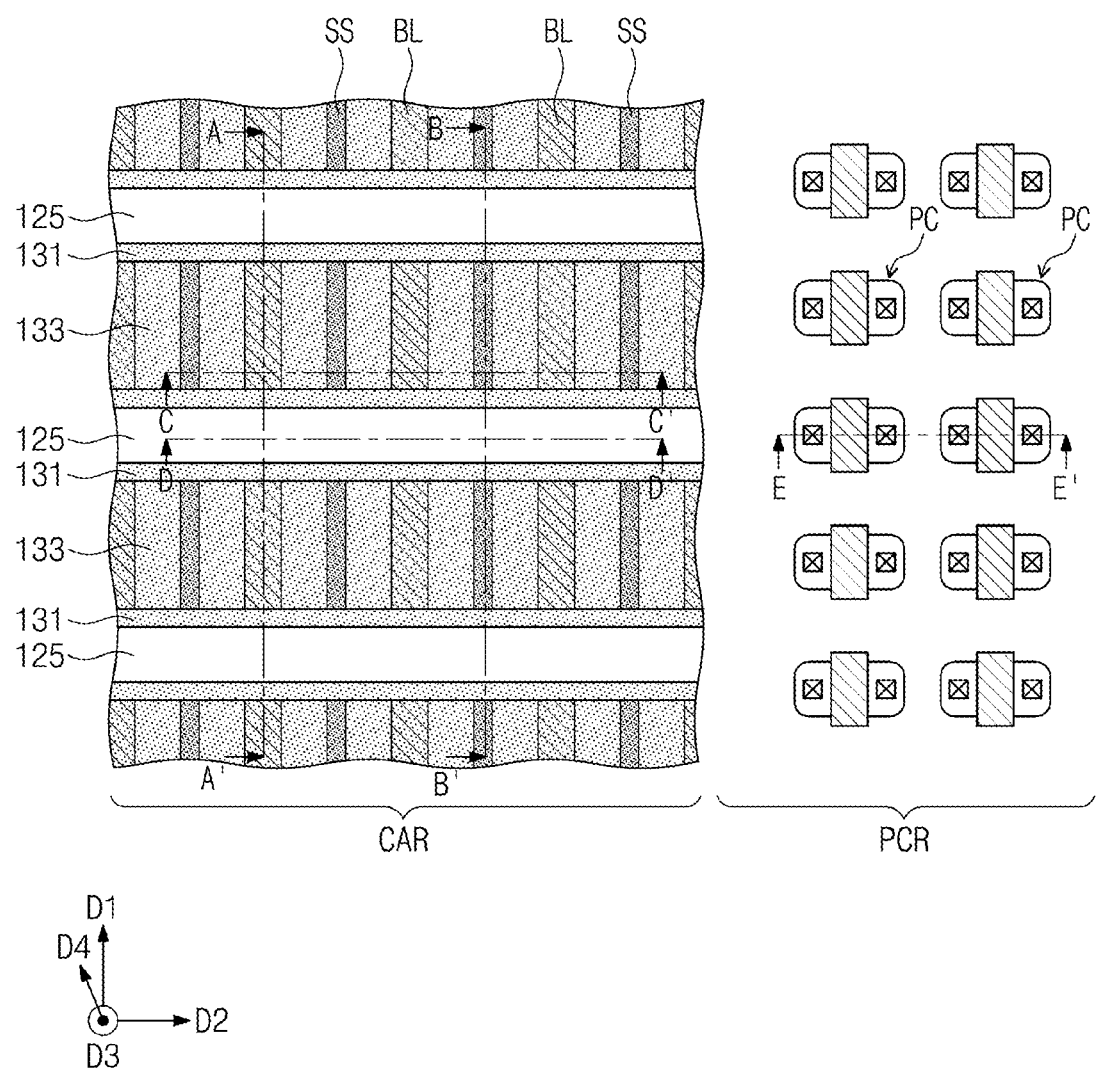
Figure 16B:
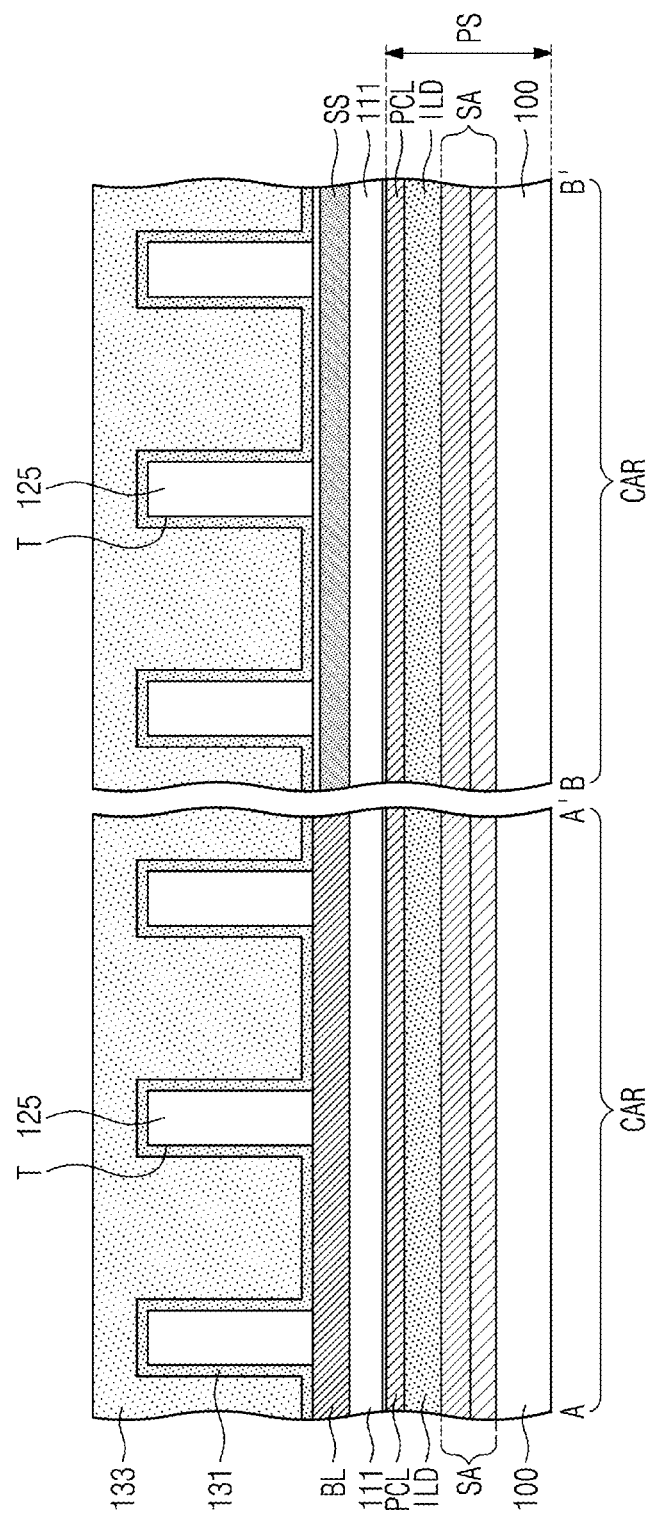
Figure 16C:
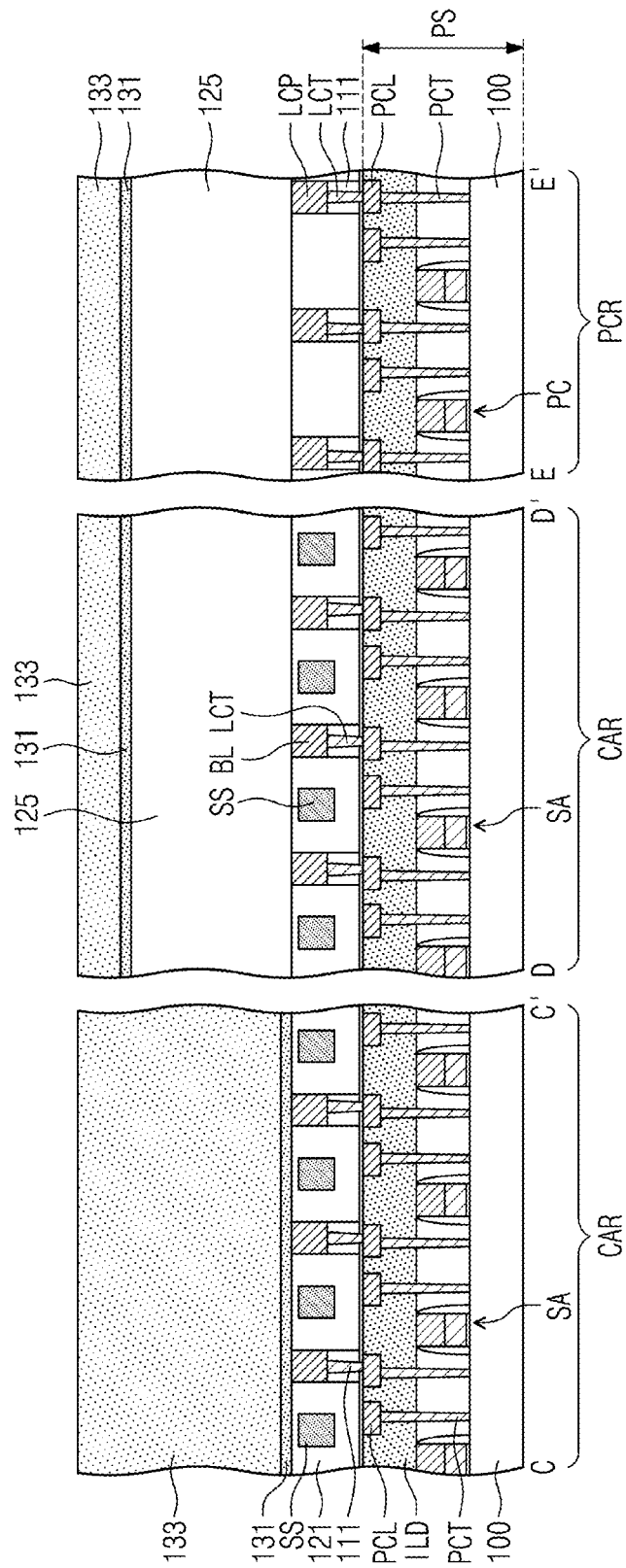

Referring to FIGS. 16A, 16B, and 16C, a channel layer 131 may be formed to conformally cover the mold insulating pattern 125 having the trenches T. The channel layer 131 may be in contact with the bit lines BL, in the trenches T, and may cover the top and side surfaces of the mold insulating pattern 125.

The channel layer 131 may be formed using at least one of, e.g., physical vapor deposition (PVD), thermal chemical vapor deposition (thermal CVD), low pressure chemical vapor deposition (LP-CVD), plasma-enhanced chemical vapor deposition (PE-CVD), or atomic layer deposition (ALD) technologies. The channel layer 131 may cover bottom and inner side surfaces of the trenches T with a substantially uniform thickness. A thickness of the channel layer 131 may be smaller than half the width of the trench. The channel layer 131 may be deposited to have a thickness of several nanometers to several tens of nanometers (e.g., of 1 nm to 30 nm) and in particular to have a thickness of 1 nm to 10 nm. The channel layer 131 may be formed of or include at least one of semiconductor materials, oxide semiconductor materials, or two-dimensional semiconductor materials. The channel layer 131 may be formed of or include at least one of, e.g., silicon, germanium, silicon germanium, or indium gallium zinc oxide (IGZO).

A first sacrificial layer 133 may be formed on the channel layer 131 to fill the trenches. The first sacrificial layer 133 may have a substantially flat top surface. The first sacrificial layer 133 may be formed of or include an insulating material having an etch selectivity with respect to the mold insulating pattern 125. For example, the first sacrificial layer 133 may be one of insulating layers, which are formed by a spin-on-glass (SOG) technique, or a silicon oxide layer.

Figure 17A:
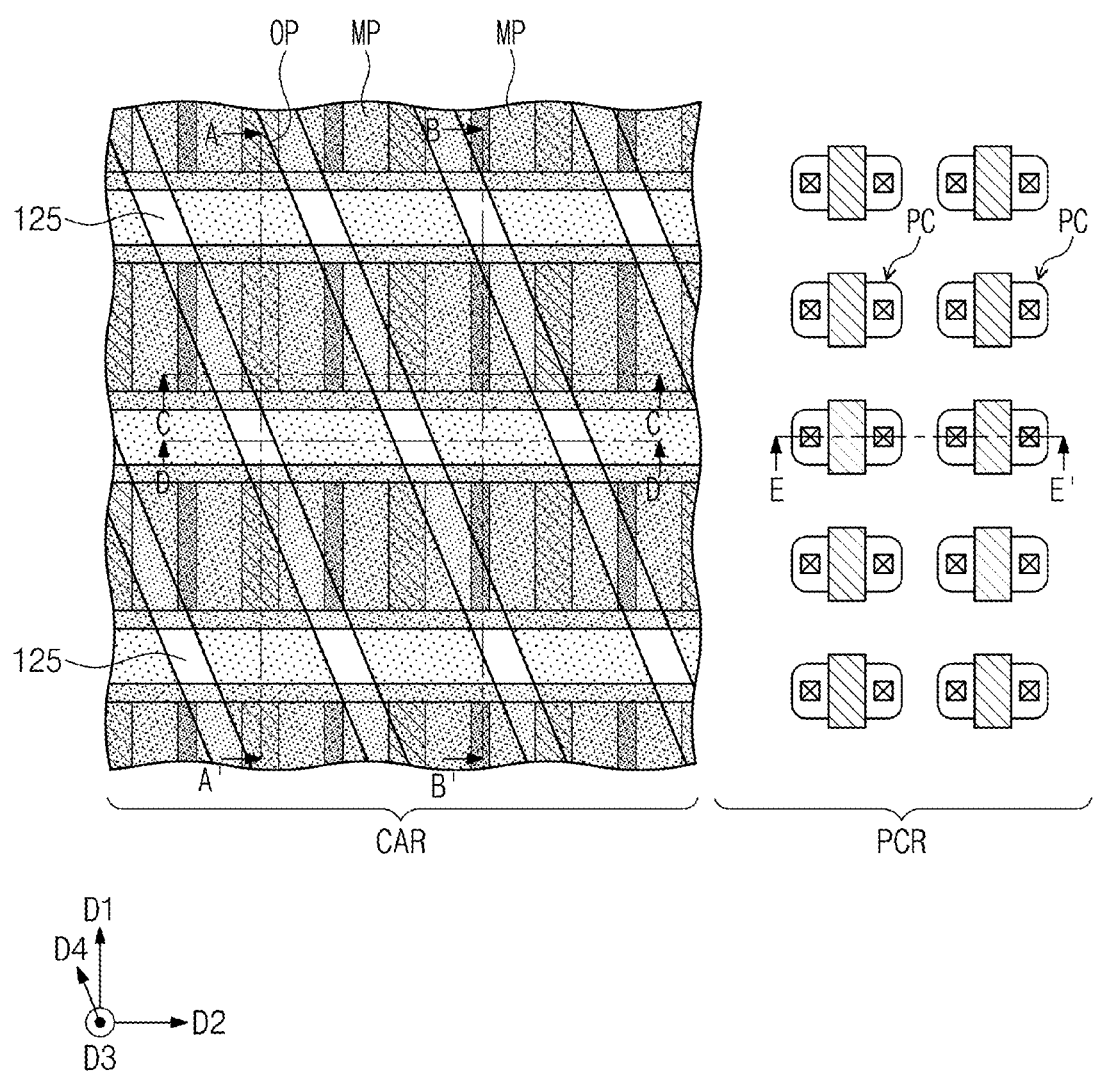
Figure 17B:
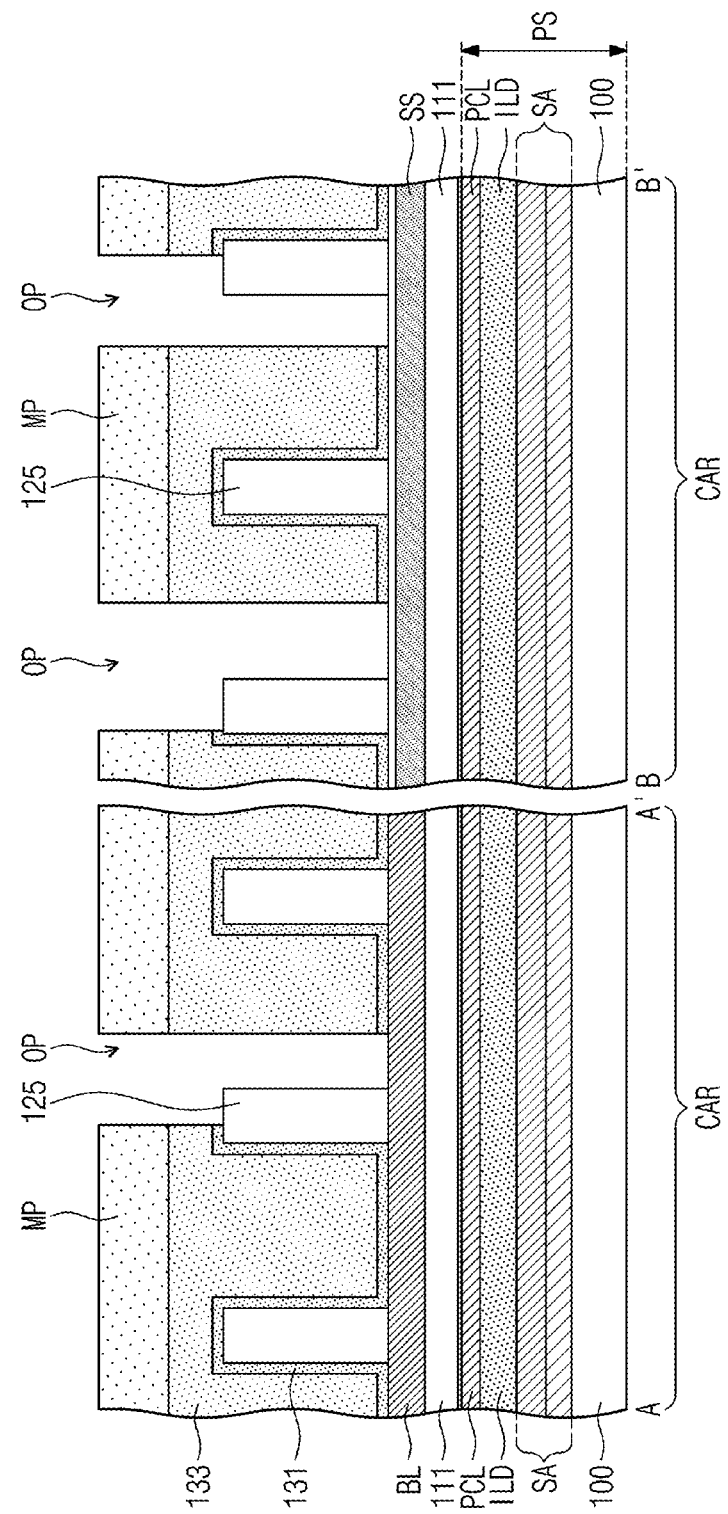
Figure 17C:
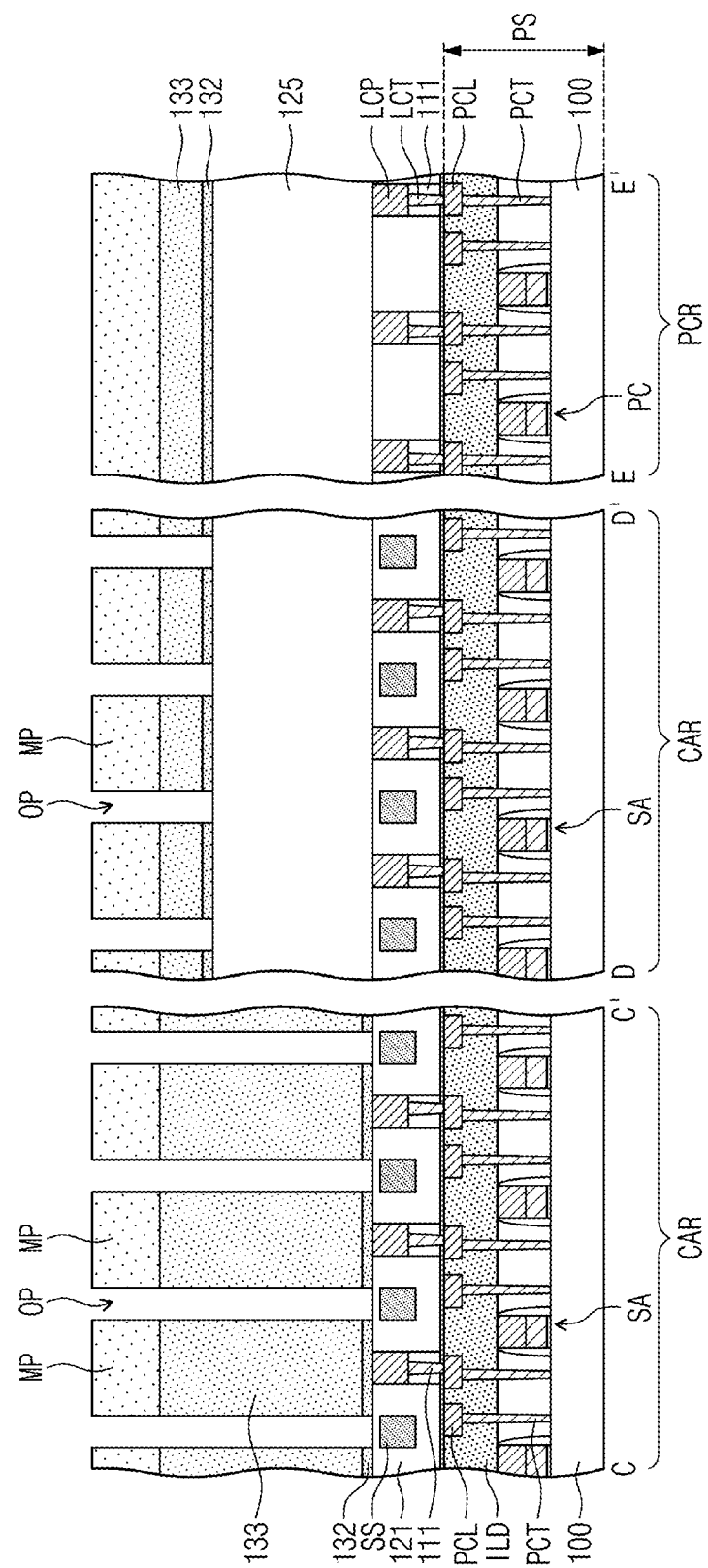

Referring to FIGS. 17A, 17B, and 17C, a mask pattern MP may be formed on the first sacrificial layer 133.

The mask pattern MP may be disposed to cross the bit lines BL and the mold insulating pattern 125. The mask pattern MP may have openings, each of which has a long axis in the fourth direction D4 that is inclined to both of the first and second directions D1 and D2. The openings of the mask pattern MP may be formed to be parallel to each other.

Next, the first sacrificial layer 133 and the channel layer 131 may be sequentially etched using the mask pattern MP as an etch mask to form openings OP exposing portions of the first insulating pattern 121 and portions of the bit lines BL.

As a result of the formation of the openings OP, preliminary channel patterns 132 may be formed in each of the trenches T. The preliminary channel patterns 132 may be spaced apart from each other in the second direction D2. After the formation of the preliminary channel patterns 132, an ashing process may be performed to remove the mask pattern MP.

Figure 18A:
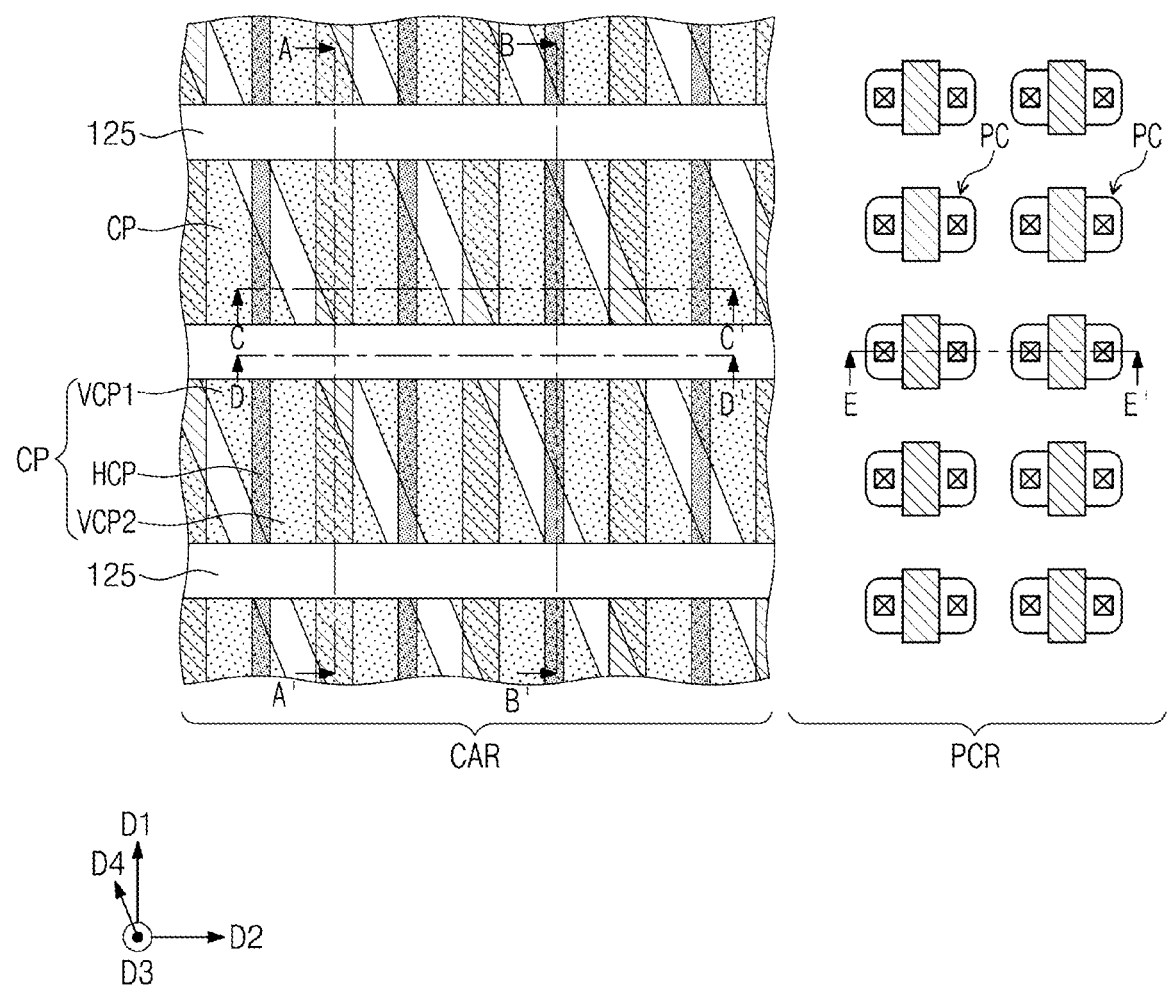
Figure 18B:
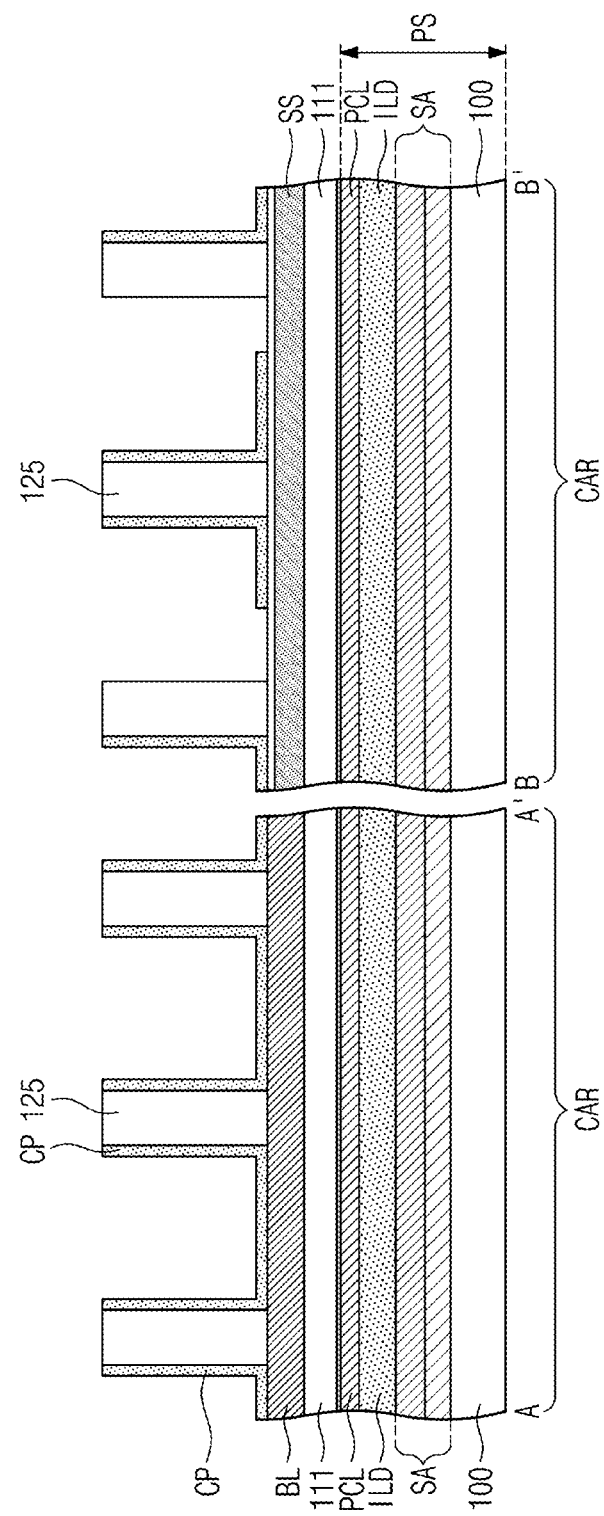
Figure 18C:
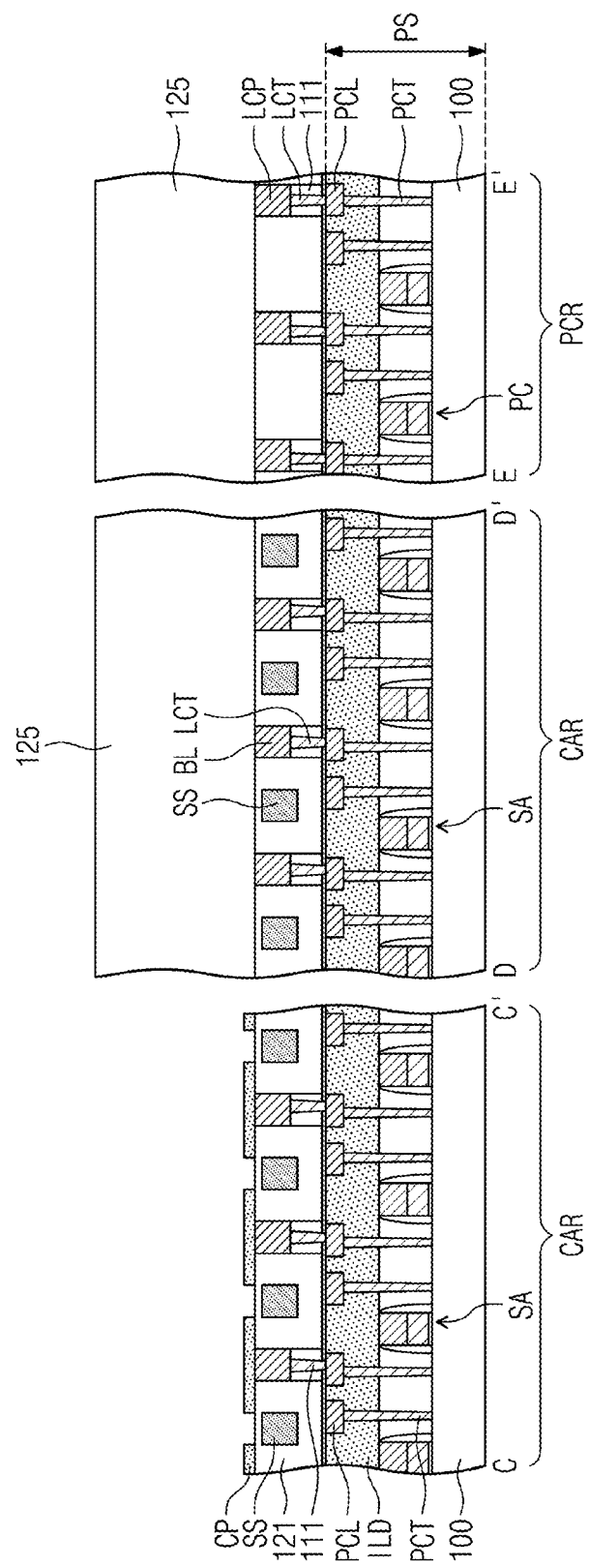

Referring to FIGS. 18A, 18B, and 18C, after the formation of the preliminary channel patterns 132, a second sacrificial layer may be formed to fill the openings. The second sacrificial layer may be formed of the same material as the first sacrificial layer 133.

After the formation of the second sacrificial layer, the first sacrificial layer 133, the second sacrificial layer, and the preliminary channel patterns 132 may be planarized to expose the top surface of the mold insulating pattern 125.

Accordingly, the channel patterns CP, a first sacrificial pattern, and a second sacrificial pattern may be formed. The channel patterns CP, the first sacrificial pattern, and the second sacrificial pattern may have top surfaces that are coplanar with the top surface of the mold insulating pattern 125.

The channel patterns CP may be formed to be spaced apart from each other in the second and fourth directions D2 and D4. Each of the channel patterns CP may include a horizontal channel portion, which is in contact with the bit line BL, and a pair of vertical channel portions, which are extended from the horizontal channel portion to be in contact with the side surfaces of each trench T. The channel patterns CP may be spaced apart from each other in the fourth direction D4, with the mold insulating pattern 125 interposed therebetween, and may be spaced apart from each other in the second direction D2 in each trench T.

After the formation of the channel patterns CP, the first and second sacrificial patterns may be removed using an etch recipe that is chosen to have an etch selectivity with respect to the mold insulating pattern 125 and the channel patterns CP. Accordingly, the surfaces of the channel patterns CP may be exposed. In an embodiment, each of the channel patterns CP may have a parallelogram or diamond shape, when viewed in a plan view.

Figure 19A:
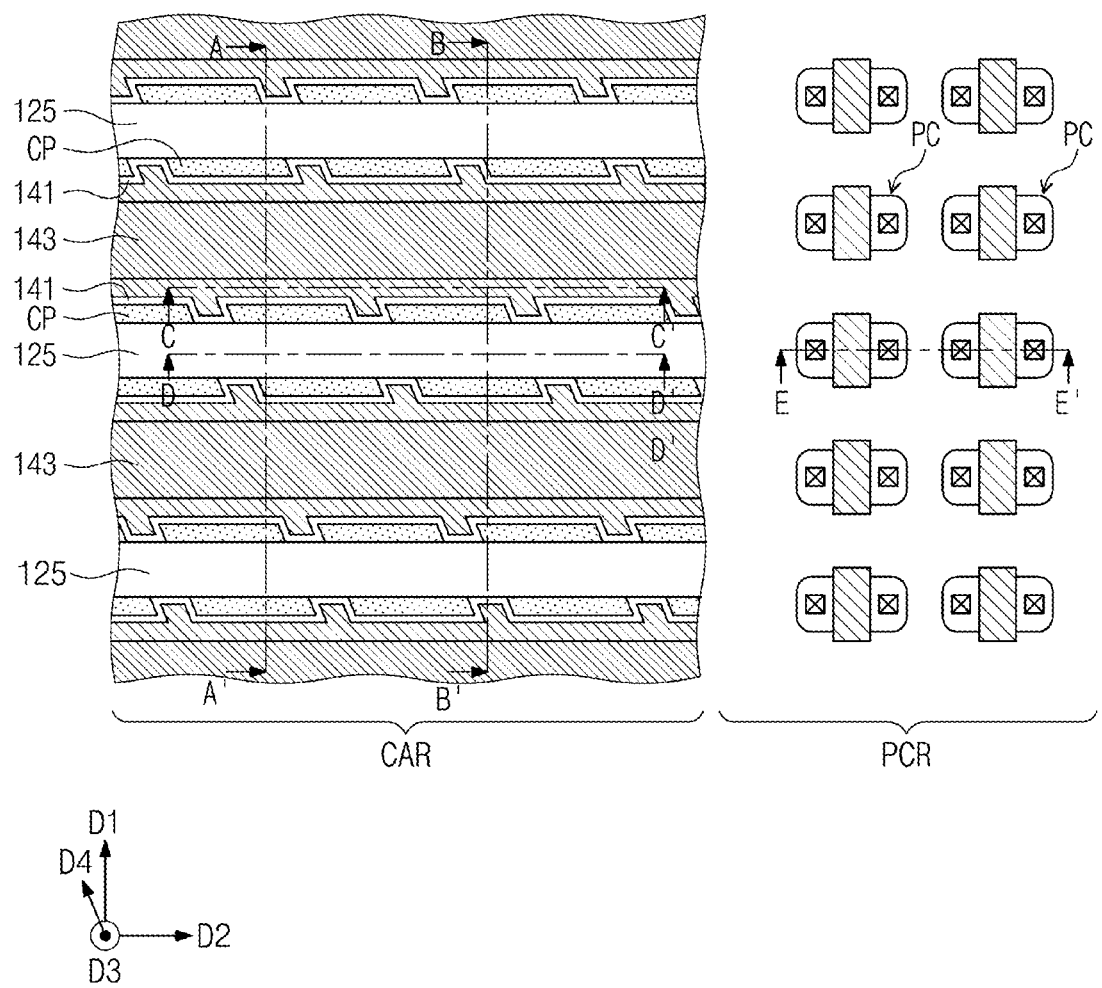
Figure 19B:
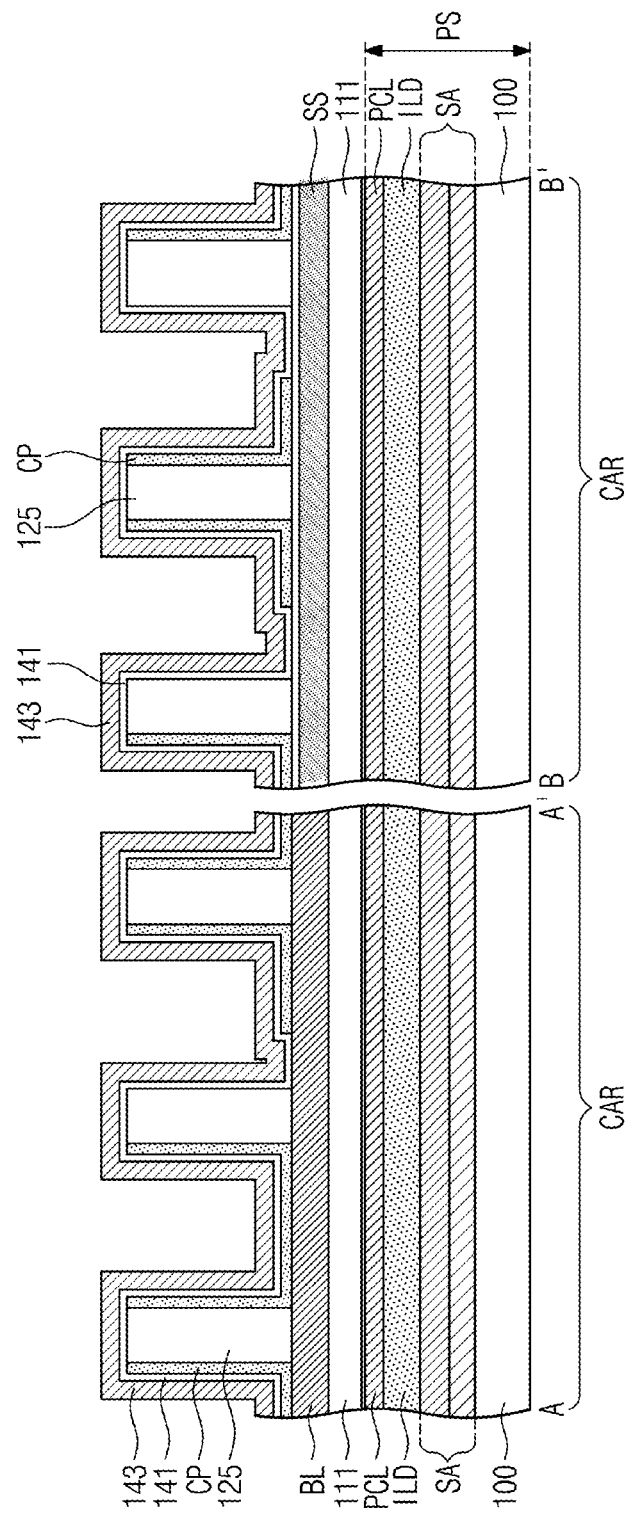
Figure 19C:
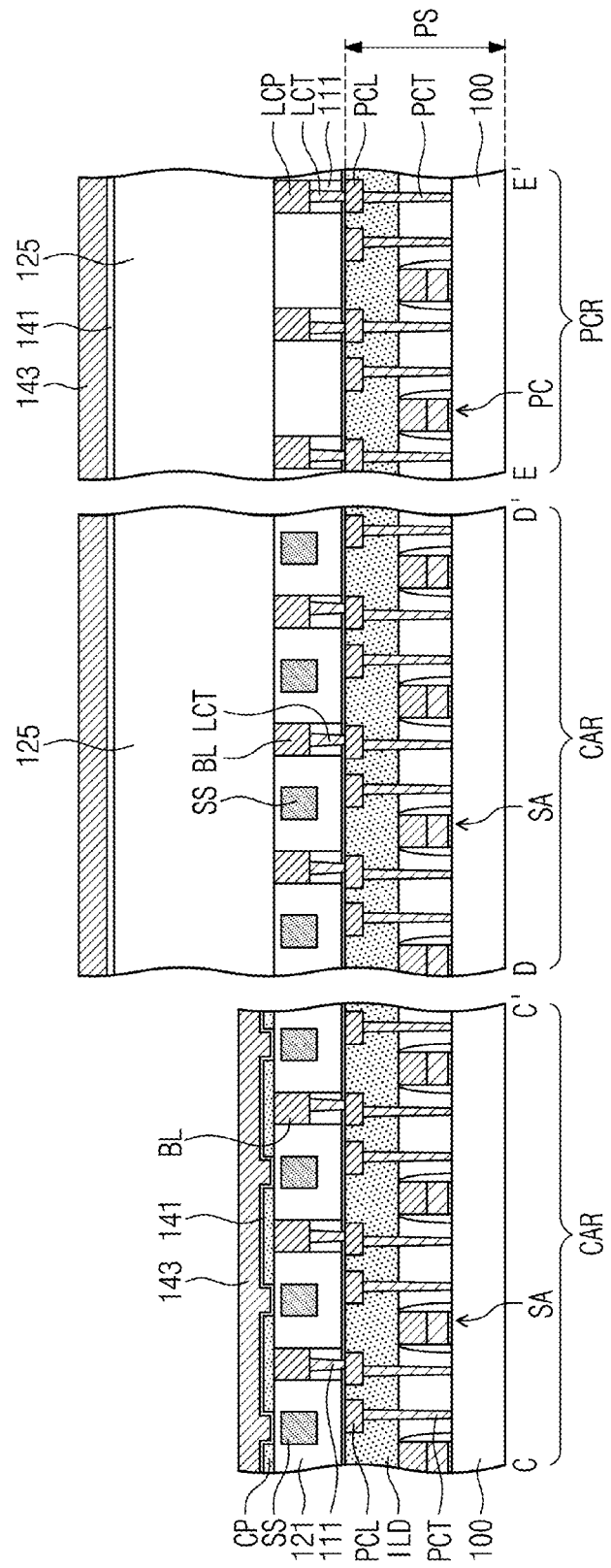

Thereafter, referring to FIGS. 19A, 19B, and 19C, a gate insulating layer 141 and a gate conductive layer 143 may be sequentially deposited to conformally cover the channel patterns CP.

The gate insulating layer 141 and the gate conductive layer 143 may cover the horizontal and vertical channel portions of the channel patterns CP with a substantially uniform thickness. A sum of thicknesses of the gate insulating layer 141 and the gate conductive layer 143 may be smaller than half the width of the trench T. Accordingly, the gate conductive layer 143 may be deposited on the gate insulating layer 141 to define a gap region in the trench. In an embodiment, after the formation of the gate conductive layer 143, a spacer layer may be formed on the gate conductive layer 143.

The gate insulating layer 141 and the gate conductive layer 143 may be formed using at least one of, e.g., physical vapor deposition (PVD), thermal chemical vapor deposition (thermal CVD), low-pressure chemical vapor deposition (LP-CVD), plasma-enhanced chemical vapor deposition (PE-CVD), and atomic layer deposition (ALD) technologies.

Figure 20A:
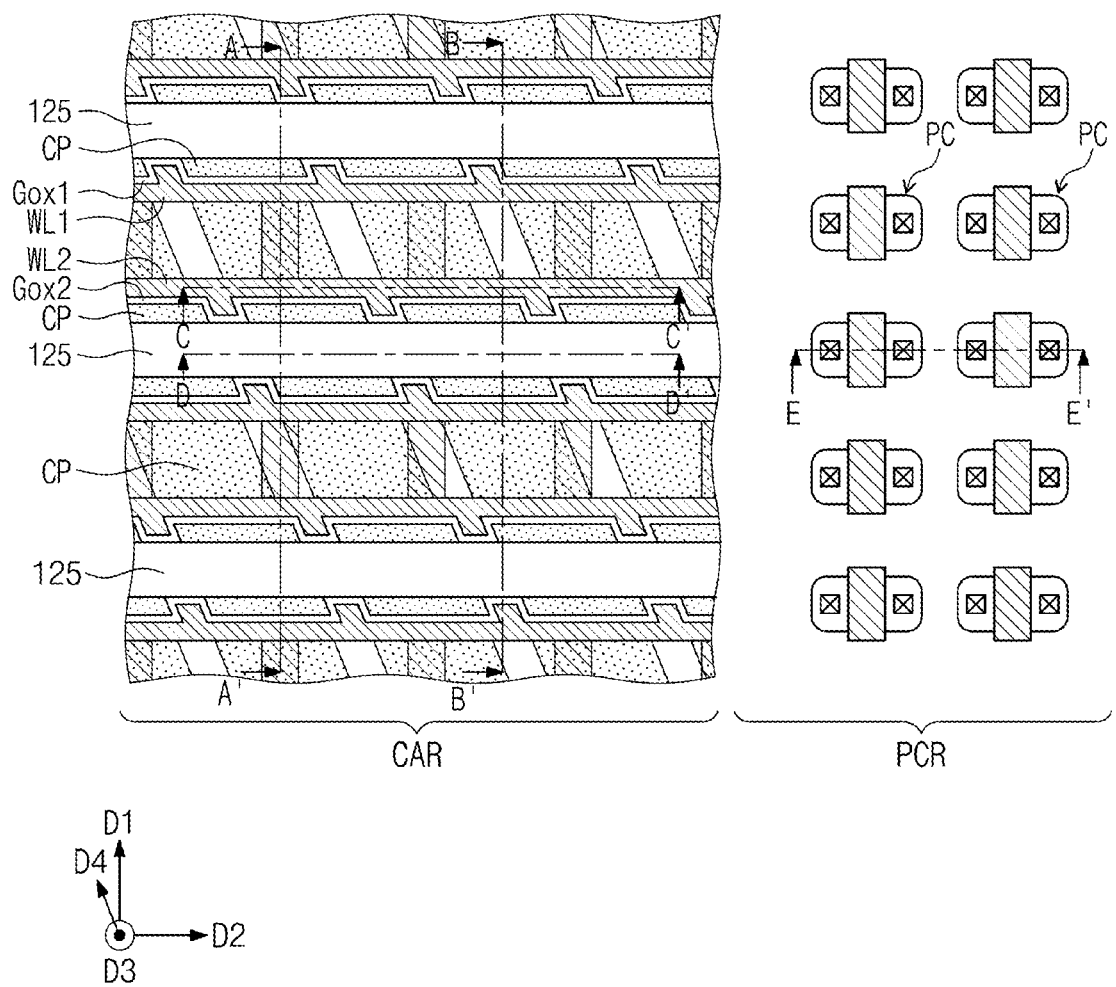
Figure 20B:
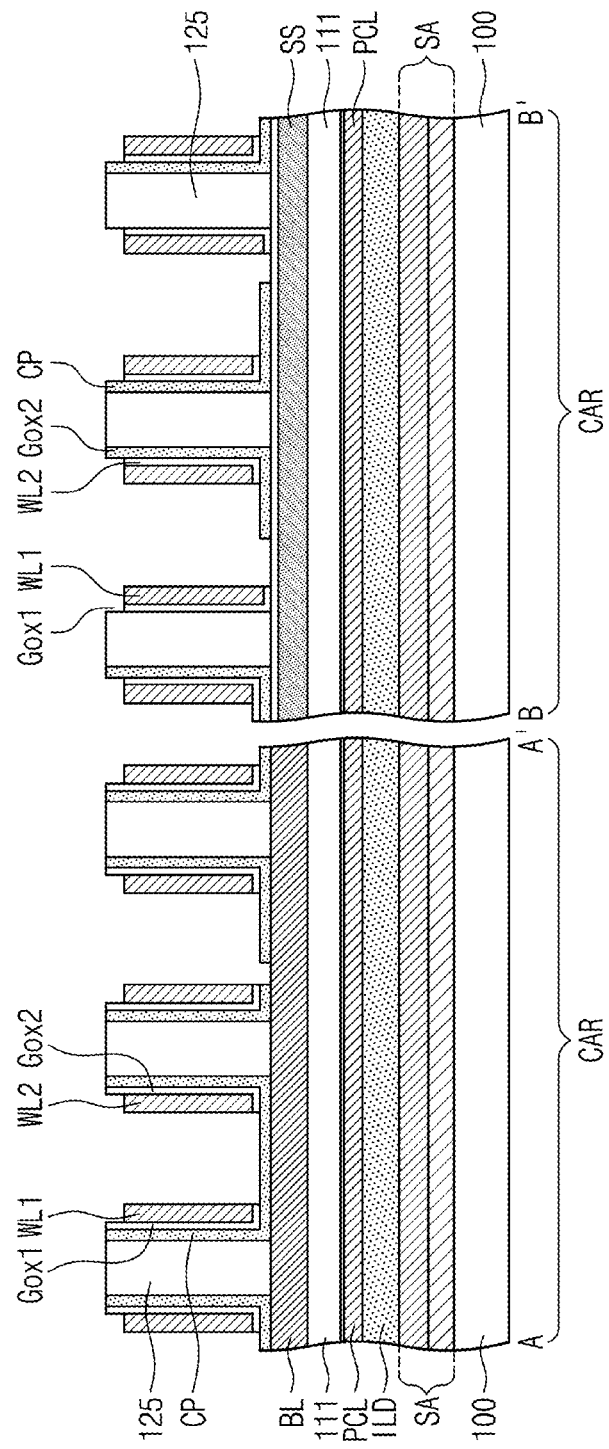
Figure 20C:
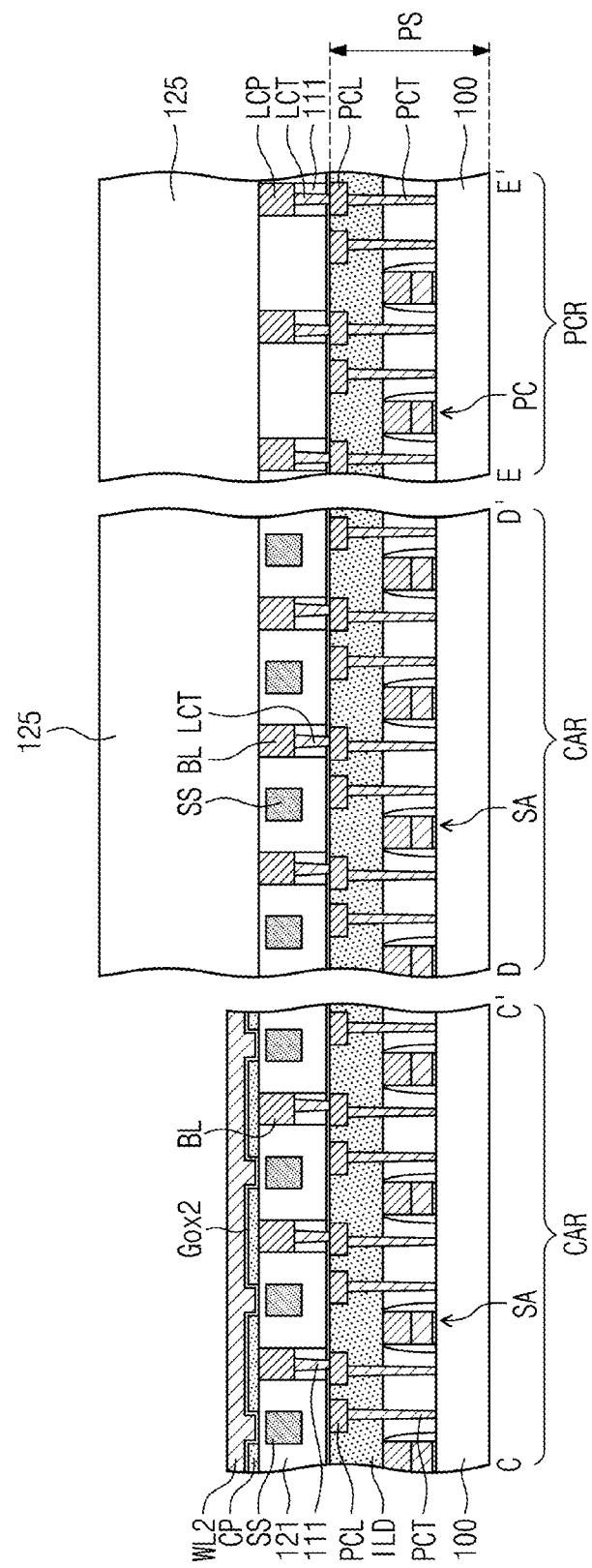

Next, referring to FIGS. 20A, 20B, and 20C, an anisotropic etching process may be performed on the gate conductive layer 143 to form a pair of the first and second word lines WL1 and WL2, which are spaced apart from each other in each trench T. During the anisotropic etching process on the gate conductive layer 143, the first and second word lines WL1 and WL2 may have top surfaces that are lowered than a top surface of the channel pattern CP. In an embodiment, an etching process of recessing the top surfaces of the first and second word lines WL1 and WL2 may be additionally performed.

In an embodiment, the gate insulating pattern Gox may also be etched during the anisotropic etching process on the gate conductive layer 143, and in this case, the channel pattern CP may be exposed. Accordingly, a pair of the gate insulating patterns Gox may be formed, as shown in FIG. 6C. In an embodiment, during the anisotropic etching process on the gate conductive layer 143, the gate insulating pattern Gox and the channel pattern CP may be sequentially etched to expose a lower insulating layer 110. Accordingly, a pair of the first and second channel patterns CP1 and CP2, which are spaced apart from each other, may be formed in each trench T, as shown in FIG. 6C.

Figure 21A:
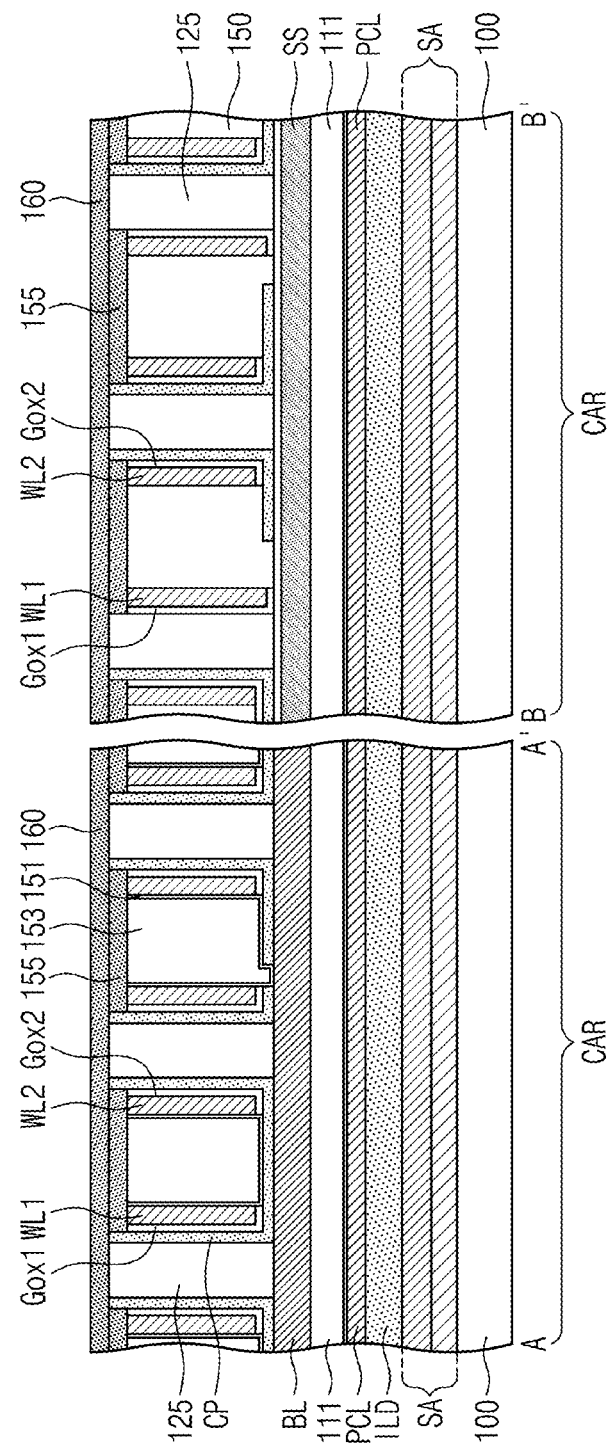
Figure 21B:
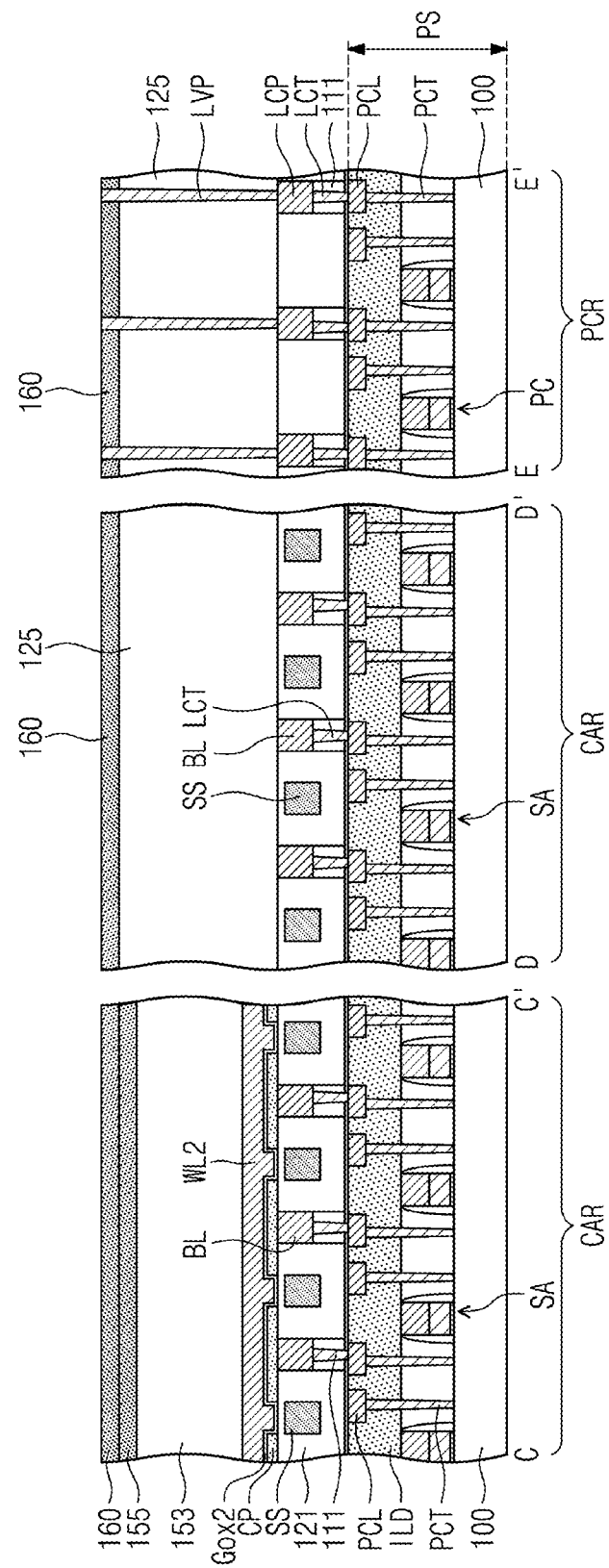

Referring to FIGS. 21A and 21B, after the formation of the first and second word lines WL1 and WL2, a first capping layer may be formed on the semiconductor substrate 100 to have a uniform thickness. Next, a second insulating layer and a second capping layer may be sequentially formed to fill the trench, in which the first capping layer is formed. Here, the first and second capping layers may be formed of or include at least one of, e.g., silicon nitride (SiN), silicon oxynitride (SiON), silicon carbide (SiC), silicon carbon nitride layer (SiCN), and combinations thereof.

A second insulating layer 152 may be formed of or include an insulating material different from a first capping layer 150. A second capping layer 154 may be formed of or include the same material as the first capping layer 150, and the second capping layer 154 may be omitted.

Thereafter, a planarization process may be performed on the first capping layer, the second insulating layer, and the second capping layer to expose the top surface of the mold insulating pattern 125. Accordingly, the first capping pattern 151, the second insulating pattern 153, and the second capping pattern 155 may be formed. The second capping pattern 155 may be formed to have a top surface that is coplanar with the top surface of the mold insulating pattern 125.

The first capping pattern 151 may be formed between a pair of the word lines WL1 and WL2 to directly cover the channel patterns CP and the first and second word lines WL1 and WL2.

Next, an etch stop layer 160 may be formed on the top surface of the semiconductor substrate 100. The etch stop layer 160 may be formed of or include an insulating material having an etch selectivity with respect to the mold insulating pattern 125. For example, the etch stop layer 160 may be formed of or include at least one of silicon nitride (SiN), silicon oxynitride (SiON), silicon carbide (SiC), silicon carbon nitride (SiCN), or combinations thereof.

After the formation of the etch stop layer 160, the lower conductive vias LVP may be formed on the peripheral circuit region PCR to penetrate the mold insulating pattern 125 and to be coupled to the lower conductive patterns LCP. After the formation of the lower conductive vias LVP, as shown in FIGS. 22A and 22B, a mask pattern may be formed on the etch stop layer 160 to expose the cell array region CAR, and then, the etch stop layer 160 may be etched using the mask pattern as an etch mask to expose the top surface of the mold insulating pattern 125 and the top surfaces of the channel patterns CP on the cell array region CAR.

Figure 22A:
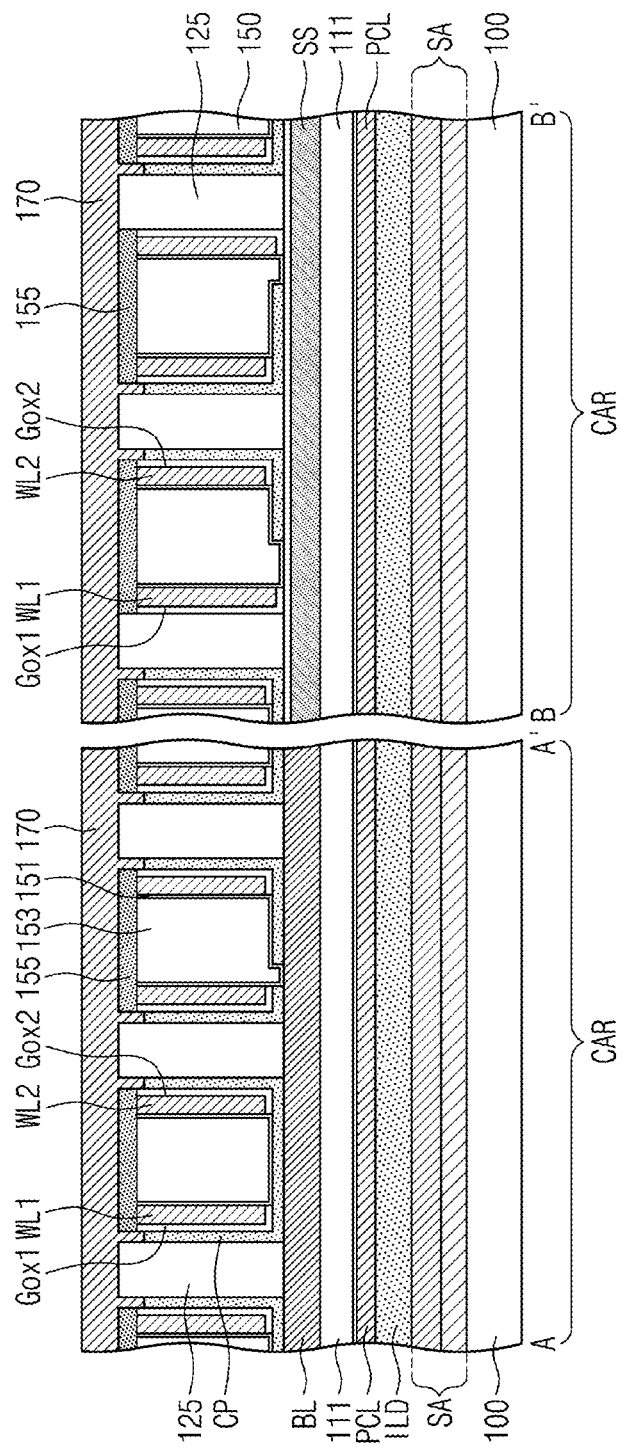
Figure 22B:
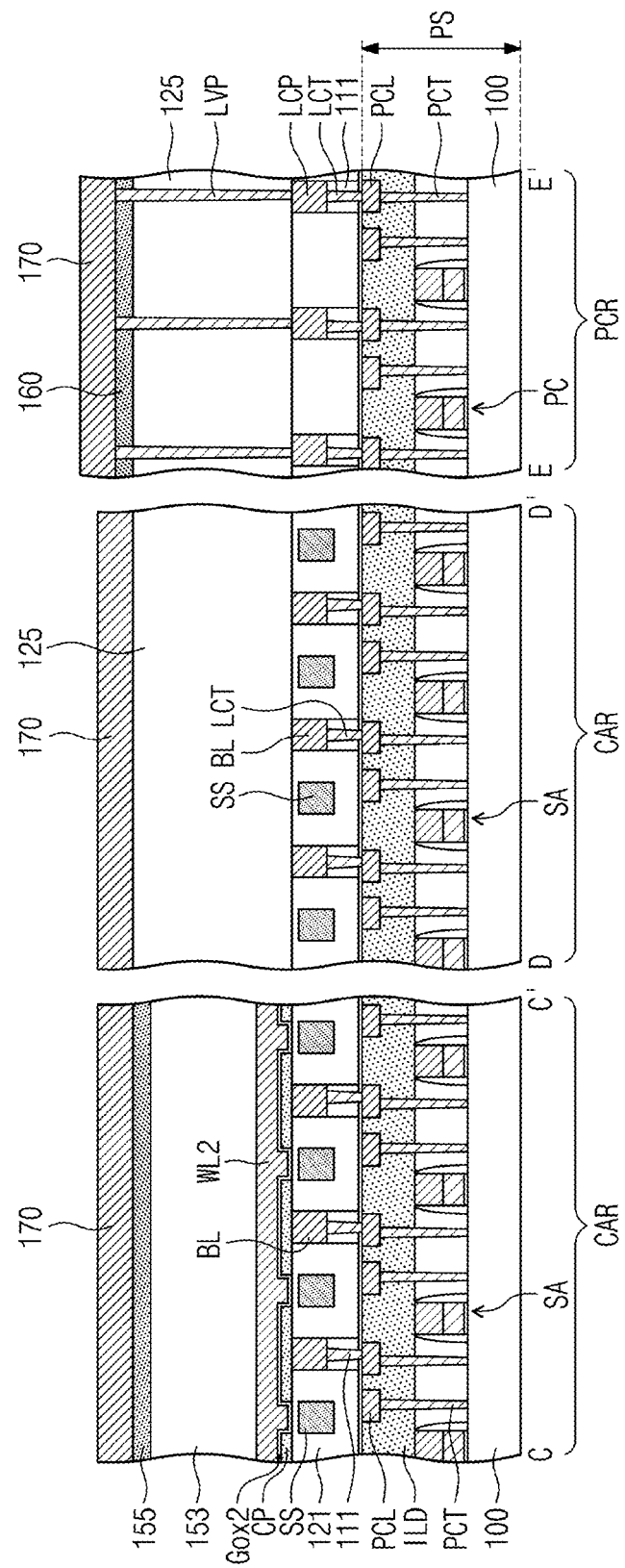

Next, referring to FIGS. 22A and 22B, an etching process may be performed on portions of the channel patterns CP to form recess regions between the mold insulating pattern 125 and the first and second gate insulating patterns Gox1 and Gox2. Accordingly, the top surfaces of the channel patterns CP may be located at a level lower than the top surface of the mold insulating pattern 125. In addition, the top surfaces of the channel patterns CP may be located at a level different from the top surfaces of the first and second word lines WL1 and WL2.

Next, a conductive layer 170 may be formed on the semiconductor substrate 100 to fill the recess regions. The conductive layer 170 may be formed of or include at least one of, e.g., doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof.

Figure 23A:
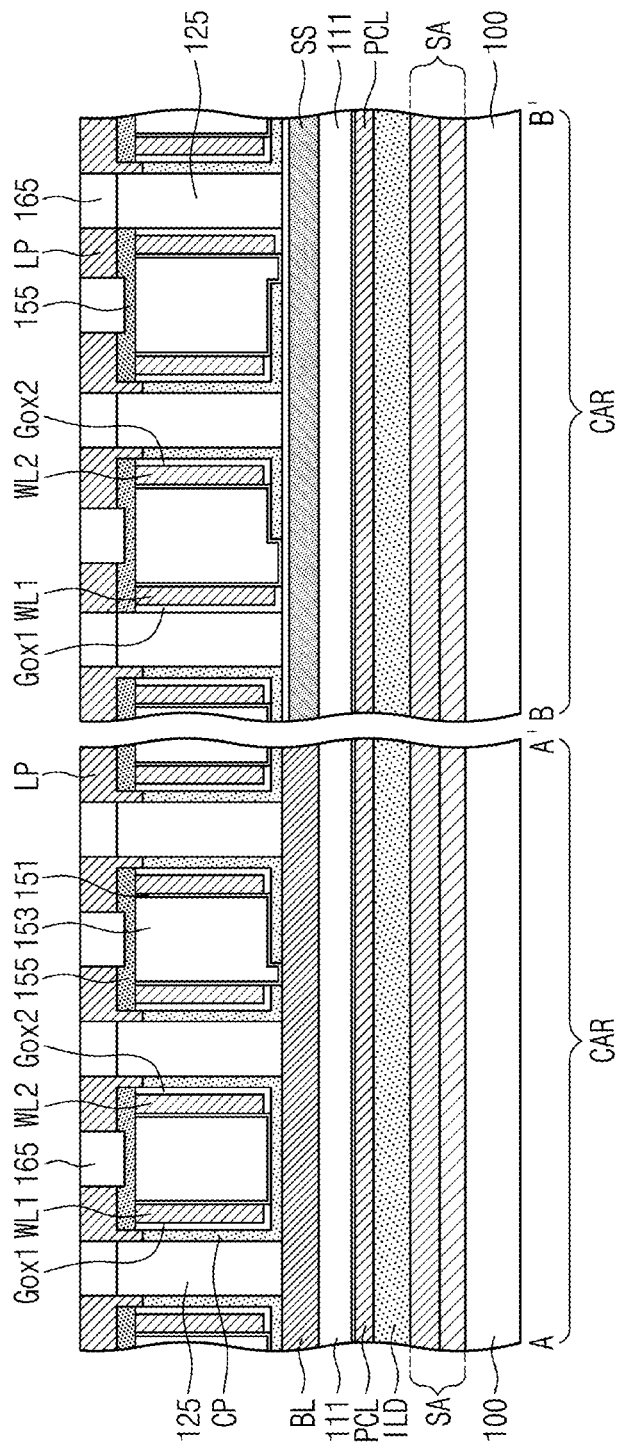
Figure 23B:
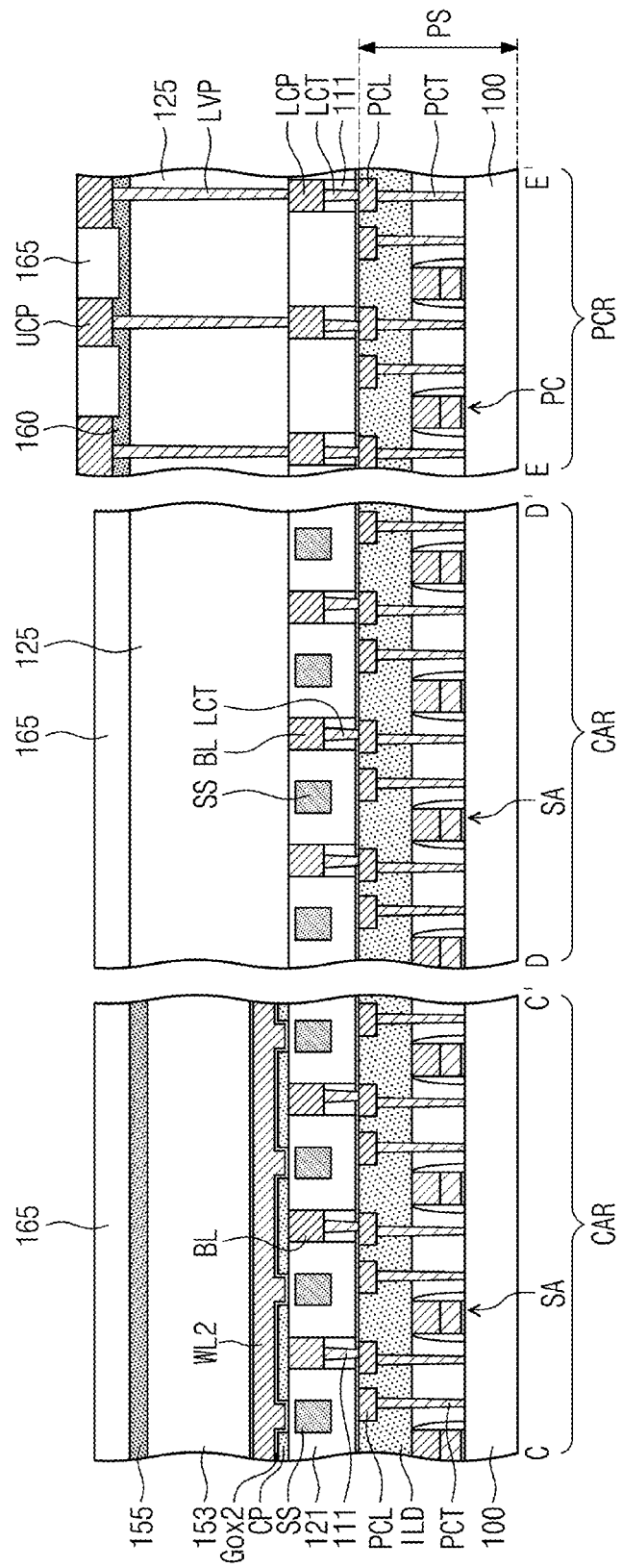

Referring to FIGS. 23A and 23B, the conductive layer 170 may be patterned to form the landing pads LP, which are in contact with the vertical portions of the channel patterns CP, respectively. In an embodiment, the upper conductive patterns UCP, which are connected to the lower conductive vias LVP, may be formed on the peripheral circuit region PCR, when the landing pads LP are formed.

The landing pads LP may be arranged to be spaced apart from each other, as shown in FIG. 3 or FIG. 7. The landing pads LP may have various shapes, e.g., circular, elliptical, rectangular, square, diamond, hexagonal shapes, when viewed in a plan view.

After the formation of the landing pads LP and the upper conductive patterns UCP, the third insulating patterns 165 may be formed to fill regions between the landing pads LP and the upper conductive patterns UCP.

Next, referring to FIGS. 3, 4A, and 4B, the etch stop layer 171 may be formed to cover the top surfaces of the landing pads LP and the upper conductive patterns UCP.

The data storage patterns DSP may be formed on the landing pads LP, respectively. In the case where the data storage pattern DSP includes a capacitor, bottom electrodes, a capacitor dielectric layer, and a top electrode may be sequentially formed. Here, the bottom electrodes may be formed to penetrate the etch stop layer 171 and may be connected to the landing pads LP, respectively.

After the formation of the data storage patterns DSP, the fourth insulating layer 173 may be formed to cover the top surface of the semiconductor substrate 100. The upper conductive vias UVP may be formed on the peripheral circuit region PCR to penetrate the fourth insulating layer 173 and may be coupled to the upper conductive patterns UCP.

By way of summation and review, an embodiment provides a semiconductor memory device with improved electrical characteristics and an increased integration density. That is, according to an embodiment, a channel pattern and word lines, which are formed to have mirror symmetry, may be used to realize vertical channel transistors. Accordingly, it may be possible to increase an integration density of a semiconductor memory device.

Adjacent ones of the channel patterns may be disposed in a direction that is inclined to word and bit lines, and thus, it may be possible to reduce a coupling between channel regions of adjacent ones of the vertical channel transistors. In addition, it may be possible to more efficiently dispose landing pads and data storage patterns, which are connected to the channel patterns. Accordingly, it may be possible to improve electrical characteristics of the semiconductor memory device and to increase an integration density of the semiconductor memory device.

Furthermore, since an oxide semiconductor material is used as the channel pattern, it may be possible to reduce a leakage current of a transistor. In addition, since peripheral circuits are vertically overlapped with a cell array, the integration density of the semiconductor memory device may be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
   a peripheral circuit structure including:
      peripheral circuits on a semiconductor substrate, and
      a lower insulating layer covering the peripheral circuits;
   a plurality of bit lines extending in a first direction on the peripheral circuit structure;
   a mold insulating pattern having trenches, the mold insulating pattern extending in a second direction to cross the plurality of bit lines;
   a first word line and a second word line in each of the trenches, the first word line and the second word line extending in the second direction to cross the plurality of bit lines;
   a plurality of channel patterns between the plurality of bit lines and each of the first word line and the second word lines, each channel pattern of the plurality of channel patterns including:
      a first vertical channel portion and a second vertical channel portions spaced apart from each other in a third direction, the third direction being inclined with respect to the first direction and the second directions, and
      a horizontal channel portion connecting the first vertical channel portion and the second vertical channel portions to each other;
   a gate insulating pattern between the plurality of channel patterns and each of the first word line and the second word lines, the gate insulating pattern extending in the second direction;
   a pair of landing pads connected to the first vertical channel portion and the second vertical channel portions of each channel pattern of the plurality of channel patterns, respectively; and
   a pair of data storage patterns on the pair of landing pads, respectively.

2. The semiconductor memory device as claimed in claim 1, wherein the plurality of channel patterns are spaced apart from each other in the second direction and the third directions.

3. The semiconductor memory device as claimed in claim 1, wherein the horizontal channel portion of each channel pattern of the plurality of channel patterns is in contact with a portion of a top surface of a corresponding bit line of the plurality of bit lines.

4. The semiconductor memory device as claimed in claim 1, wherein a portion of the horizontal channel portion of each channel pattern of the plurality of channel patterns is between the first word line and the second word lines.

5. The semiconductor memory device as claimed in claim 1, wherein:
   each of the trenches has a first width in the first direction, and
   each of the first word line and the second word lines has a second width smaller than half the first width in the first direction.

6. The semiconductor memory device as claimed in claim 1,
wherein a distance between the pair of the data storage patterns, which are adjacent to each other in the second direction, is substantially equal to a distance between the pair of the data storage patterns, which are adjacent to each other in the third direction.

* * * * *